US009768234B2

(12) United States Patent
Jo

(10) Patent No.: US 9,768,234 B2
(45) Date of Patent: Sep. 19, 2017

(54) RESISTIVE MEMORY ARCHITECTURE AND DEVICES

(71) Applicant: Crossbar, Inc., Santa Clara, CA (US)

(72) Inventor: Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 163 days.

(21) Appl. No.: 14/641,466

(22) Filed: Mar. 9, 2015

(65) Prior Publication Data
US 2015/0340406 A1 Nov. 26, 2015

Related U.S. Application Data

(60) Provisional application No. 62/000,952, filed on May 20, 2014.

(51) Int. Cl.
H01F 3/00 (2006.01)
H01F 41/02 (2006.01)
(Continued)

(52) U.S. Cl.
CPC ........ H01L 27/249 (2013.01); H01L 27/2409 (2013.01); H01L 45/085 (2013.01);
(Continued)

(58) Field of Classification Search
CPC . H01L 45/085; H01L 45/122; H01L 45/1226; H01L 45/1253; H01L 45/141;
(Continued)

(56) References Cited

U.S. PATENT DOCUMENTS 6,849,891 B1 2/2005 Hsu et al.
6,855,975 B2 2/2005 Gilton
(Continued)

FOREIGN PATENT DOCUMENTS

CN 1506972 A 6/2004
CN 101501850 A 8/2009
(Continued)

OTHER PUBLICATIONS

Chinese Office Action dated Nov. 23, 2015 for Chinese Patent Application No. 201280027066.9, 6 pages.
(Continued)

Primary Examiner — Paul D Kim
(74) Attorney, Agent, or Firm — Amin, Turocy & Watson, LLP

(57) ABSTRACT

Providing a high-density two-terminal memory architecture (s) having performance benefits of two-terminal memory and relatively low fabrication cost, is described herein. By way of example, the two-terminal memory architecture(s) can be constructed on a substrate, in various embodiments, and comprise two-terminal memory cells formed within conductive layer recess structures of the memory architecture. In one embodiment, a conductive layer recess can be created as a horizontal etch in conjunction with a vertical via etch. In another embodiment, the conductive layer recess can be patterned for respective conductive layers of the two-terminal memory architecture.

20 Claims, 21 Drawing Sheets

(51) Int. Cl.
*H01L 27/24* (2006.01)
*H01L 45/00* (2006.01)

(52) U.S. Cl.
CPC ........ *H01L 45/122* (2013.01); *H01L 45/1226* (2013.01); *H01L 45/1253* (2013.01); *H01L 45/141* (2013.01); *H01L 45/146* (2013.01); *H01L 45/148* (2013.01); *H01L 45/1608* (2013.01); *H01L 45/1666* (2013.01); *Y10T 29/49071* (2015.01)

(58) Field of Classification Search
CPC . H01L 45/146; H01L 45/148; H01L 45/1608; H01L 45/1666; H01L 27/249; H01L 27/2409
USPC .............. 29/603.13–603.16, 603.18
See application file for complete search history.

(56) References Cited

U.S. PATENT DOCUMENTS

| | | | |
|---|---|---|---|
| 7,176,530 B1 | 2/2007 | Bulucea et al. | |
| 7,187,577 B1 | 3/2007 | Wang et al. | |
| 7,274,064 B2 | 9/2007 | Bertin et al. | |
| 7,280,390 B2 | 10/2007 | Kostylev et al. | |
| 7,368,752 B2 | 5/2008 | Luyken et al. | |
| 7,388,775 B2 | 6/2008 | Bedeschi et al. | |
| 7,579,612 B2 | 8/2009 | Tang et al. | |
| 7,704,788 B2 | 4/2010 | Youn et al. | |
| 7,786,464 B2 | 8/2010 | Nirschl et al. | |
| 7,791,060 B2 | 9/2010 | Aochi et al. | |
| 7,829,875 B2 | 11/2010 | Scheuerlein | |
| 7,830,698 B2 | 11/2010 | Chen et al. | |
| 7,835,174 B2 | 11/2010 | Tokiwa | |
| 7,859,884 B2 | 12/2010 | Scheuerlein | |
| 7,881,097 B2 | 2/2011 | Hosomi et al. | |
| 7,897,953 B2 | 3/2011 | Liu | |
| 7,920,412 B2 | 4/2011 | Hosotani et al. | |
| 7,924,138 B2 | 4/2011 | Kinoshita et al. | |
| 7,961,506 B2 | 6/2011 | Liu | |
| 8,004,882 B2 | 8/2011 | Katti et al. | |
| 8,018,760 B2 | 9/2011 | Muraoka et al. | |
| 8,045,364 B2 | 10/2011 | Schloss et al. | |
| 8,067,815 B2 | 11/2011 | Chien et al. | |
| 8,102,698 B2 | 1/2012 | Scheuerlein | |
| 8,164,948 B2 | 4/2012 | Kattie et al. | |
| 8,218,350 B2 | 7/2012 | Kozicki | |
| 8,278,170 B2* | 10/2012 | Lee ................... | H01L 27/11551 257/E21.645 |
| 8,320,160 B2 | 11/2012 | Nazarian | |
| 8,329,537 B2* | 12/2012 | Kim .................... | H01L 21/321 257/E21.212 |
| 8,351,241 B2 | 1/2013 | Lu et al. | |
| 8,369,139 B2 | 2/2013 | Liu et al. | |
| 8,411,485 B2 | 4/2013 | Nazarian et al. | |
| 8,502,185 B2 | 8/2013 | Lu et al. | |
| 8,587,050 B2 | 11/2013 | Ohba | |
| 8,659,933 B2 | 2/2014 | Jo | |
| 8,735,247 B2* | 5/2014 | Yoo ................... | H01L 27/11578 257/328 |
| 8,767,441 B2 | 7/2014 | Lu et al. | |
| 8,993,397 B2 | 3/2015 | Herner | |
| 9,023,719 B2* | 5/2015 | Pachamuthu ..... | H01L 21/28282 257/316 |
| 9,305,624 B2* | 4/2016 | Shepard ............ | G11C 13/0004 |
| 2004/0170040 A1 | 9/2004 | Rinerson et al. | |
| 2006/0097238 A1 | 5/2006 | Breuil et al. | |
| 2006/0231910 A1 | 10/2006 | Hsieh et al. | |
| 2007/0268744 A1 | 11/2007 | Taguchi | |
| 2008/0192531 A1 | 8/2008 | Tamura et al. | |
| 2009/0014707 A1 | 1/2009 | Lu et al. | |
| 2009/0122592 A1 | 5/2009 | Tokiwa | |
| 2009/0231910 A1 | 9/2009 | Liu et al. | |
| 2010/0124093 A1 | 5/2010 | Shiga et al. | |
| 2010/0157656 A1 | 6/2010 | Tsuchida | |
| 2010/0176367 A1 | 7/2010 | Liu | |
| 2010/0237314 A1 | 9/2010 | Tsukamoto et al. | |
| 2010/0243983 A1 | 9/2010 | Chiang et al. | |
| 2010/0252909 A1* | 10/2010 | Nakanishi ............ | H01L 27/101 257/532 |
| 2011/0033967 A1 | 2/2011 | Lutz et al. | |
| 2011/0089391 A1 | 4/2011 | Mihnea et al. | |
| 2011/0149639 A1 | 6/2011 | Carter et al. | |
| 2011/0305065 A1 | 12/2011 | Nazarian et al. | |
| 2011/0310656 A1 | 12/2011 | Kreupl et al. | |
| 2011/0317470 A1 | 12/2011 | Lu et al. | |
| 2012/0007035 A1 | 1/2012 | Jo et al. | |
| 2012/0044751 A1 | 2/2012 | Wang et al. | |
| 2012/0112156 A1 | 5/2012 | Park et al. | |
| 2012/0122290 A1 | 5/2012 | Nagashima | |
| 2012/0132971 A1 | 5/2012 | Mikasa | |
| 2012/0176831 A1 | 7/2012 | Xiao et al. | |
| 2012/0187410 A1 | 7/2012 | Yamazaki et al. | |
| 2012/0211719 A1 | 8/2012 | Haimoto et al. | |
| 2012/0236650 A1 | 9/2012 | Nazarian | |
| 2012/0250395 A1 | 10/2012 | Nodin | |
| 2012/0305879 A1 | 12/2012 | Lu et al. | |
| 2012/0314472 A1 | 12/2012 | Chung | |
| 2013/0264534 A1 | 10/2013 | Hwang et al. | |
| 2013/0313508 A1 | 11/2013 | Kawasaki | |
| 2013/0334593 A1* | 12/2013 | Seol ................... | H01L 21/32137 257/324 |
| 2014/0063903 A1 | 3/2014 | Chang et al. | |
| 2014/0092669 A1 | 4/2014 | Chen et al. | |
| 2014/0112058 A1 | 4/2014 | Kellam et al. | |
| 2014/0231740 A1 | 8/2014 | Ohba | |
| 2014/0284544 A1 | 9/2014 | Miyagawa et al. | |
| 2014/0292365 A1 | 10/2014 | Said | |
| 2015/0070966 A1 | 3/2015 | Bandyopadhyay et al. | |
| 2015/0076579 A1* | 3/2015 | Tsuji ................... | H01L 29/7926 257/314 |
| 2015/0179662 A1* | 6/2015 | Makala ............... | H01L 27/11582 257/314 |
| 2016/0104715 A1* | 4/2016 | Pachamuthu ..... | H01L 27/11582 257/316 |
| 2016/0204117 A1* | 7/2016 | Liu ..................... | H01L 29/66825 257/324 |
| 2016/0211386 A1 | 7/2016 | Tomai et al. | |
| 2016/0268341 A1 | 9/2016 | Nazarian | |

FOREIGN PATENT DOCUMENTS

| | | | |
|---|---|---|---|
| CN | 102986048 A | 3/2013 | |
| CN | 103682091 A | 3/2014 | |
| JP | 2001249324 A | 9/2001 | |
| JP | 2008277543 A | 11/2008 | |
| JP | 2009267185 A | 11/2009 | |
| JP | 2010009669 A | 1/2010 | |
| JP | 2010087007 A | 4/2010 | |
| JP | 2010519762 A | 6/2010 | |
| JP | 2010186872 A | 8/2010 | |
| JP | 01123645 A | 2/2011 | |
| JP | 2011129639 A | 6/2011 | |
| JP | 2014036034 A | 2/2014 | |
| TW | 201214673 A | 4/2012 | |
| WO | 2011005266 A1 | 1/2011 | |
| WO | 2013052321 A2 | 4/2013 | |

OTHER PUBLICATIONS

Office Action dated Oct. 3, 2013 for U.S. Appl. No. 13/921,157, 10 pages.
International Search Report and Written Opinion for PCT Application No. PCT/US2012/040232 mailed Feb. 26, 013,9 pages.
Office Action dated May 7, 2013 for U.S. Appl. No. 13/585,759, 12 pages.
Office Action dated May 23, 2013 for U.S. Appl. No. 13/592,224, 9 pages.
Notice of Allowance dated Sep. 19, 2013 for U.S. Appl. No. 13/585,759,9 pages.
Office Action dated Dec. 6, 2013 for U.S. Appl. No. 13/960,735, 10 pages.

(56) References Cited

OTHER PUBLICATIONS

International Search Report and Written Opinion for PCT Application No. PCT/US2013/054976 mailed Dec. 16, 2013, 9 pages.
Notice of Allowance dated Jul. 22, 2015 for U.S. Appl. No. 14/612,025, 11 pages.
Office Action dated Jul. 14, 2016 for U.S. Appl. No. 14/793,392, 28 pages.
Office Action dated Jul. 13, 2016 for U.S. Appl. No. 14/755,998, 22 pages.
Office Action dated Aug. 3, 2015 for U.S. Appl. No. 14/717,185, 26 Pages.
Office Action dated Jul. 6, 2016 for U.S. Appl. No. 14/726,071, 25 Pages.
Ex Parte Quayle Office Action dated Aug. 18, 2016 for U.S. Appl. No. 14/795,105, 13 Pages.
Office Action dated May 31, 2016 for U.S. Appl. No. 14/678,112, 14 pages.
Notice of Allowance dated Oct. 20, 2016 for U.S. Appl. No. 15/066,504, 28 pages.
Japanese Office Action dated Aug. 2, 2016 for Japanese Application No. 2015-102280, 13 pages (including translation).
Taiwanese Office Action dated Aug. 19, 2016 for Taiwanese Application No. 104107381, 7 pages (including translation).
Japanese Office Action dated Aug. 9, 2016 for Japanese Application No. 2015-137033, 6 pages (including translation).
Taiwanese Office Action dated Aug. 11, 2016 for Taiwanese Application No. 104121989, 10 pages (including translation).
Office Action dated Mar. 17, 2015 for U.S. Appl. No. 14/573,770, 19 Pages.
International Search Report and Written Opinion for PCT Application No. PCT/US2015/17370 mailed Jul. 13, 2015, 17 Pages.
Wouters, "Scaling challenges for 2-terminal select devices," ITRS ERD Selector Workshop, Apr. 2012, 41 pages, IMEC, Noorderwijk, NL.
Office Action dated May 27, 2015 for U.S. Appl. No. 14/588,185, 23 pages.
Taiwanese Office Action dated Oct. 19, 2016 for Taiwanese Application No. 104122122, 7 pages (including translation).
Office Action dated Dec. 15, 2016 for U.S. Appl. No. 14/726,071, 62 pages.
Wolf, "Silicon Processing for the VLSI Era vol. 3: The Submicron Mosfet", Lattice Press, 1995, pp. 200-201.
Office Action dated Dec. 29, 2016 for U.S. Appl. No. 15/195,417, 38 pages.
Korean Office Action dated Feb. 27, 2017 for Korean Application No. 10-2015-0096673, 7 pages (including English translation).
Korean Office Action dated Mar. 6, 2017 for Korean Application No. 10-2015-0097600, 5 pages (including English translation).
Chinese Office Action dated Dec. 27, 2016 for Chinese Patent Application No. 201510105630.X, 16 pages (including English translation).
Japanese Office Action dated Mar. 7, 2017 for Japanese Application Serial No. JP2015-102280, 3 pages.
Office Action dated Jun. 19, 2012 for U.S. Appl. No. 13/149,757, 11 pages.
Office Action dated Dec. 6, 2013 for U.S. Appl. No. 13/960,735, 19 pages.
Office Action dated Apr. 8, 2016 for U.S. Appl. No. 14/573,770, 8 pages.
Office Action dated Mar. 30, 2017 for U.S. Appl. No. 14/726,071, 64 pages.
Chinese Office Action dated Apr. 5, 2017 for Chinese Patent Application No. 201510260810.5, 16 pages (including English translation).

\* cited by examiner

RESISTIVE MEMORY ARCHITECTURE AND DEVICES

CROSS REFERENCE TO RELATED APPLICATIONS

This application for patent claims the benefit of U.S. provisional patent application Ser. No. 62/000,952, entitled RESISTIVE RAM AND DEVICES and filed May 20, 2014, and is related to co-pending U.S. non-provisional patent application Ser. No. 14/588,185, entitled SELECTOR DEVICE FOR TWO-TERMINAL MEMORY and filed Dec. 31, 2014, which claims the benefit of U.S. provisional patent application Ser. No. 61/951,454, entitled SELECTOR DEVICE FOR TWO TERMINAL DEVICE and filed Mar. 11, 2014, and claims the benefit of U.S. provisional patent application Ser. No. 62/021,660, entitled FAST APPLICATIONS and filed Jul. 7, 2014, each of which are incorporated by reference herein in their respective entireties and for all purposes.

TECHNICAL FIELD

This disclosure relates generally to solid state memory; for example, various disclosed embodiments provide an architecture that facilitates fabrication of two and three dimensional memory arrays on an insulated semiconductor substrate.

BACKGROUND

A recent innovation within the field of integrated circuit technology is resistive memory. While much of resistive memory technology is in the development stage, various technological concepts for resistive memory have been demonstrated by the assignee of the present invention(s) and are in one or more stages of verification to prove or disprove associated theory(ies). Even so, resistive memory technology promises to hold substantial advantages over competing technologies in the semiconductor electronics industry.

Resistive random access memory (RRAM) is one example of resistive memory, and while random access memory historically carries the connotation of volatility, the assignee has proposed non-volatile models of RRAM. Further, the inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistive switching is a result of formation of a conductive structure within an otherwise electrically insulating medium. The conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electrochemical processes in binary oxides (e.g., NiO, $TiO_2$, or the like), or by a redox process for ionic conductors including oxides, chalcogenides, polymers, and so on.

In light of the above, the inventors endeavor to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide a high-density two-terminal memory architecture(s) having performance benefits of two-terminal memory and relatively low fabrication cost. The two-terminal memory architecture(s) can be constructed on a substrate, in various embodiments, and comprise two-terminal memory cells formed within conductive layer recess structures of the memory architecture. In one embodiment, a conductive layer recess can be created as a horizontal etch in conjunction with a vertical via etch. In another embodiment, the conductive layer recess can be patterned for respective conductive layers of the two-terminal memory architecture.

In further embodiments, the two-terminal memory cells can comprise layers arranged or stacked along an oblique angle relative to a normal direction of the substrate. The oblique angle arrangement can facilitate a three-dimensional architecture providing increased memory density, in various embodiments. In additional embodiments, the oblique angle arrangement can facilitate technology node scalability, where thickness of a film can at least in part control a critical dimension of two-terminal memory cells.

In various embodiments, the two-terminal memory architecture can be fabricated in conjunction with an integrated chip. In some embodiments, two-terminal memory architectures can be fabricated on the integrated chip as a monolithic process. Moreover, the process can include electronic interconnection between subsets of the memory architecture and subsets of CMOS devices on or within the integrated chip. According to further embodiments, there are disclosed one or more electronic devices comprising the two-terminal memory architecture and CMOS devices.

In a further embodiment(s), the subject disclosure provides a method for forming a device comprising a three-dimensional memory device. The method can comprise disposing a first wordline material layer upon an insulated semiconductor substrate, disposing a first insulating material layer upon the first wordline material layer, disposing a second wordline material layer upon the first insulating material layer and disposing a second insulating material layer upon the second wordline material layer. Further, the method can comprise forming a via through the first wordline material layer, the first insulating material layer, the second wordline material layer and the second insulating material layer, wherein the first wordline material layer and the second wordline material layer are over etched within the via to form a first recess in the first wordline material layer and to form a second recess in the second wordline material layer. Moreover, the method can comprise depositing a selection material within the first recess and the second recess of the via, wherein the selection material is in electrical contact with the first wordline material layer and the second wordline material layer and forming a contact material within the first recess and the second recess of the via, wherein the contact material is in electrical contact with the selection material. Further, the method can comprise depositing a switching material layer within the via, in electrical contact with the selection material within the first recess and the second recess of the via and in electrical contact with the contact material within the first recess and the second recess of the via and depositing a bitline material layer within the via, in electrical contact with the switching material.

In additional embodiments, there is provided a device including a three-dimensional memory device. The device can comprise a first wordline material layer disposed upon an insulated semiconductor substrate, a first insulating material layer disposed upon the first wordline material layer, a second wordline material layer disposed upon the first insulating material layer and a second insulating material layer disposed upon the second wordline material layer. In addition to the foregoing, the device can comprise a via formed through the first wordline material layer, the first insulating material layer, the second wordline material layer and the second insulating material layer, wherein the first wordline material layer and the second wordline material layer are over etched within the via to form a first recess in the first wordline material layer and to form a second recess in the second wordline material layer. Further, the device can comprise a selection material disposed within the first recess and the second recess of the via, wherein the selection material is in electrical contact with the first wordline material layer and the second wordline material layer and a contact material disposed within the first recess and the second recess of the via, wherein the contact material is in electrical contact with the selection material. Moreover, the device can comprise a switching material layer disposed within the via, in electrical contact with the selection material within the first recess and the second recess of the via and in electrical contact with the contact material within the first recess and the second recess of the via and a bitline material layer disposed within the via, in electrical contact with the switching material.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
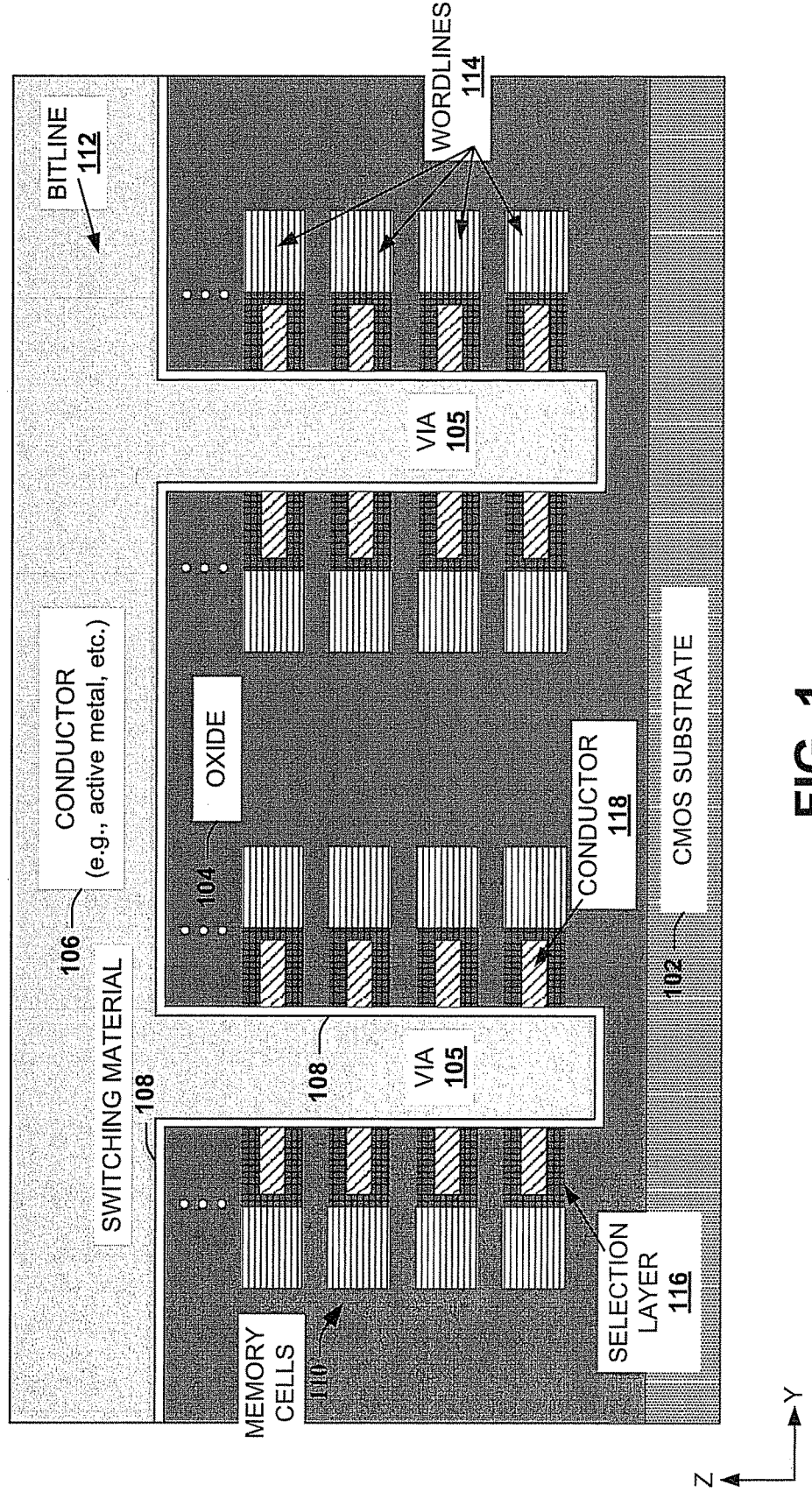
FIG. 1 depicts a block diagram of a sample memory architecture according to one or more disclosed embodiments.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a conductive material, (e.g., a contact layer comprising a doped p-type or n-type silicon (Si) bearing layer, such as a p-type or n-type polysilicon, a doped polycrystalline compound, such as a p-type or n-type polycrystalline SiGe, and so forth), a resistive switching layer (RSL), e.g., a resistive material including a plurality of defect locations, and an active metal layer capable of being ionized (e.g., to facilitate generation of particles, including metal ions, within or at a boundary of the RSL). Under suitable bias conditions, the particles can occupy defect locations within the RSL to provide a conductive region (e.g., a conductive filament(s)) of the RSL. Upon removal of the bias condition (e.g., in a volatile device) or in response to a second bias condition (e.g., in a non-volatile device), the conductive region of the RSL can become non-conductive. This can occur, for instance, in response to the particles becoming neutral (non-ionized) (e.g., following removal of the bias condition), the particles at least in part vacating the defect locations (e.g., in response to the second bias condition), or another suitable mechanism.

A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), a non-stoichiometric oxide, metal oxide (e.g. Zinc Oxide) and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable positive number), $AlO_E$ (where E is a suitable positive number) and so forth, or a suitable combination thereof.

An active metal layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum(Ta), tantalum-nitride (TaN), iron (Fe), manganese (Mn), tungsten (W), vanadium (V), hafnium (Hf), cobalt (Co), platinum (Pt), palladium (Pd), and a suitable alloy of the foregoing. Other suitable conductive materials, as well as compounds or combinations of the foregoing or similar materials can be employed for the active metal layer in some aspects of the subject disclosure. In some embodiments, a relatively thin layer of barrier material (e.g., 20 nanometers or less, 10 nanometers or less, etc.) composed of Ti, TiOx, TiN, or the like, can be disposed between the RSL and the active metal layer. Additional embodiments of the subject disclosure similar to the foregoing example(s) can be found in the following U.S. patent applications that are licensed to the assignee of the present application for patent application Ser. No. 11/875,541 filed Oct. 19, 2007 and application Ser. No. 12/575,921 filed Oct. 8, 2009, and others cited herein, each of which are incorporated by reference herein in their respective entireties and for all purposes.

To program a filamentary-based resistive switching memory cell, a suitable program voltage can be applied across the memory cell causing a conductive path or a filament to form within a relatively high resistive portion of the memory cell, such as a RSL. Filament formation can comprise a dynamic change in width or length of a group of ionized particles through a portion of the RSL that is suitable to cause the RSL to switch from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Though resistive-switching memory technology is referred to for many disclosed embodiments, other two-terminal memory technologies can be utilized for some of the disclosed embodiments, where suitable to one of ordinary skill in the art.

Various embodiments of the subject disclosure provide high-density solid-state memory architectures that can be fabricated on an insulated semiconductor substrate. In various embodiments, a disclosed memory architecture(s) can be fabricated as a low-cost monolithic process utilizing advanced technology nodes, such as 28 nanometer (nm) or smaller technology nodes, and can comprise at least one recess etch. In an embodiment(s), the recess etch(es) can be provided with a via etch and recess etch, which can be combined as a single etch or implemented as multiple etches. In another embodiment, the recess etch(es) can be a patterned conductor process forming a break(s) or discontinuity(ies) in a conductive layer of a solid state process.

In at least some disclosed embodiments, the present disclosure provides a memory cell configured to mitigate leakage current. In at least one disclosed embodiment, the memory cell can be utilized in a 1 transistor-n memory cell architecture, where n can be an integer larger than 1 (e.g., 128, 256, 512, 1024, and so forth). The inventors of the present disclosure believe that increased numbers n of two-terminal memory cells per transistor in a memory array can yield greatly improved memory densities over 1 transistor-1 memory cell architectures, particularly in disclosed three-dimensional architectures. The inventors believe that increased n may, in some architectures, result in leakage current (e.g., see FIG. 8, infra), reduced sensing margin, increasing power consumption, and the like, on large conductive lines. This can be evident for neighboring memory cells programmed to a low resistance state, as one example. A memory cell is disclosed having a selector device that can be fabricated as part of a monolithic process in series with a memory cell and in a 1 transistor-n memory cell architecture, that can reduce leakage current by a factor of 1000, a factor of 10,000, a factor of 100,000, a factor of 1,000,000, or a factor of 10,000,000, in various disclosed embodiments.

In another embodiment, disclosed memory architectures can incorporate high performance two-terminal solid state memory, such as resistive-switching memory cells, yielding very high performance, as well as high density memory integrated or partially integrated with (e.g., electronically or communicatively connected to) other electronic circuitry on an insulated semiconductor substrate. Such other circuitry can include, for example, one or more processors, logic arrays, buffers, controllers, bitline controllers, wordline controllers, and so forth. Alternatively or in addition, various disclosed memory architectures can be disposed on a flexible or rigid circuit board having additional components, which can interact electronically or digitally with a disclosed memory architecture(s) in response to instructions to perform functions. Examples of additional components can include, for instance, a communication interface, a wireless interface, a display driver, a power control driver, a user interface controller, an accelerometer, a gyro, a magnetic sensor, a pressure sensor, a coil, an inductor, a capacitor, a suitable micro-electromechanical systems (MEMS) device, a memory controller, a media input or output controller, or the like, or a suitable combination thereof. In still other embodiments, the subject disclosure provides a multi-dimensional memory-on-substrate disposed on a circuit board, and packaged in a housing having one or more output interfaces (e.g., a display, a printer, an audio output, a speaker, etc.), one or more input interfaces (e.g., keyboard, keypad, mouse, touchpad, microphone, camera, video camera, trackball, digital pen, and so on), one or more input/output interfaces (e.g., a physical communication interface, a biometric sensor interface, or the like), one or more power sources (e.g., battery, capacitor), and so forth. In at least one embodiment, the memory-on-substrate, circuit board, housing, interface(s), power source(s), etc., can be connected to external devices (wired or wirelessly, through direct connection or over one or more networks, etc.) such as smart phones, tablet computing devices, wearable electronics, a memory stick(s), an external memory(ies), etc.

FIG. 1 illustrates a block diagram of an example memory architecture 100 according to embodiments of the present disclosure. Memory architecture 100 can be a two-dimensional architecture (e.g., having a single layer on the z axis), or can be a three-dimensional architecture as depicted in FIG. 1. It should be appreciated that memory architecture 100 can extend further along the y axis (left and right horizontally across the page), along the x axis (in and out of the page), or can have more or fewer layers on the z axis.

Memory architecture 100 can be formed on a control logic substrate, such as a complementary metal oxide semiconductor (CMOS) substrate 102. In various disclosed embodiment, CMOS substrate 102 can be fabricated at least in part with front-end-of-line processing, and can include one or more active or passive devices, such as a transistor(s), a resistor(s), a capacitor(s), an inductor(s) or the like. In additional embodiments, other components of memory architecture 100 (e.g., oxide 104, memory cells 110, wordlines 114, bitline 112, conductor 106, and so on) can be fabricated at least in part with back-end-of-line processing. However, it should be appreciated that the subject disclosure is not so limited; other mechanisms for preparing or fabricating electronic components in or on a semiconductor are considered within the scope of the present disclosure.

Above CMOS substrate 102, can be an insulator, such as an oxide 104. Oxide 104 can be a silicon oxide, in some embodiments, although other suitable electrical insulators, including other oxides, can be utilized in addition or instead. Vias 105 can be formed within oxide 104, e.g., by etching, removing, patterning, etc., oxide material from vias 105. A set of wordlines 114 can be formed adjacent to vias 105, extending along an x axis of FIG. 1 (in and out of the page). One or more layers of memory cells 110 can be formed within recess etches (e.g., extending horizontally into oxide 104 from vias 105) between respective ones of wordlines 114 and respective ones of vias 105. For instance, a selection layer 116 can be formed within subsets of the recess etches adjacent to vias 105, in electrical contact with respective ones of wordlines 114. In one or more embodiments, a conductor (e.g., a middle electrode), can be formed in electrical contact with respective selection layers 116, for example filling remaining space of respective recess etches. Further, a switching material 108 can be formed as a layer above oxide 104 and following an edge(s) of vias 105.

Switching material 108 can be selected to have non-volatile switching characteristics, capable of maintaining two or more distinct and measurable characteristics, representing respective logical states. Examples include various distinct and measurable electrical characteristics, such as resistive characteristics, current carrying characteristics, voltage characteristics, magnetic characteristics, and so on.

Figure 3:
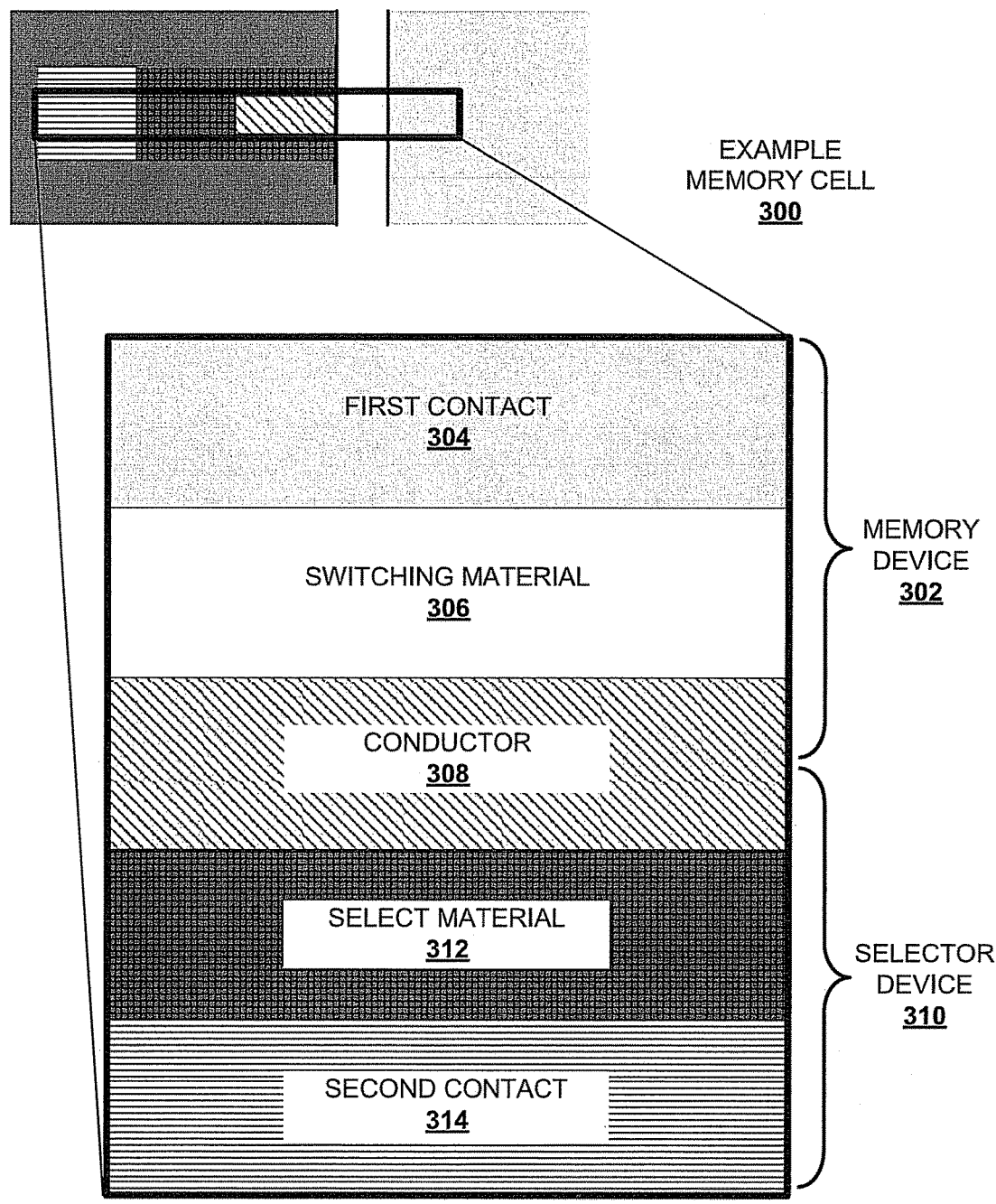
FIG. 3 depicts a diagram of a cross-section view of the example two-terminal memory cell of FIG. 2.

Vias 105 can be filled with a conductor material 106, adjacent to switching material 108 (see FIG. 3, infra, for examples of suitable materials for vias 105, switching material 108, bitline 112 and wordlines 114, as well as for other components of memory cells 110). In various embodiments, conductor 106 can comprise a bitline 112 of memory architecture 100, extending horizontally above oxide 104, in some embodiments, and vertically downward into vias 105 and between subsets of memory cells 110.

By applying a potential between bitline 112 and one of wordlines 114, an electric field can be applied across a selected one of memory cells 110, making memory cells individually addressable. In some embodiments, a suitable potential can be applied across multiple selected wordlines 114 and bitline 112, facilitating selection of multiple memory cells 110 concurrently. Accordingly, memory architecture 100 can facilitate individual addressing of memory cells 110, as well as group addressing. This in turn provides high flexibility in controlling how many, and which, memory cells 110 are affected by a particular memory operation (e.g., read, write, erase, etc.). This flexibility can improve power consumption (e.g., by excluding non-targeted cells from operations), while taking advantage of high performance capabilities of two-terminal memory technologies. Additionally, memory architecture 100 can provide very high density memory arrays, by way of a two-dimensional or three-dimensional arrangement (e.g., having multiple memory cells along each of the x, y and z axis), in conjunction with scalable technology nodes (e.g., down to 5 nanometer [nm] minimum feature size, or even smaller). Furthermore, memory architecture 100 can be fabricated at low cost, utilizing back-end-of-line processes in various disclosed embodiments, at temperatures within thermal budgets of most CMOS devices (e.g., below 400 degrees Celsius), and with relatively few masks (e.g., 1 to 4 masks per layer) in at least some disclosed embodiments. Accordingly, memory architecture 100 can provide significant advantages in the field of solid state memory.

In at least one alternative embodiment, switching material 108 can be swapped in location with selection layer 116. In such embodiment, switching material 108 can be provided within recess etches in electrical contact with respective ones of wordlines 114. Further, selection layer 116 can be deposited over oxide 104 and exposed surfaces of holes in oxide 104 created by vias 105. In this embodiment, memory cells 110 can be operable in a similar fashion as described above (or elsewhere herein).

Figure 2:
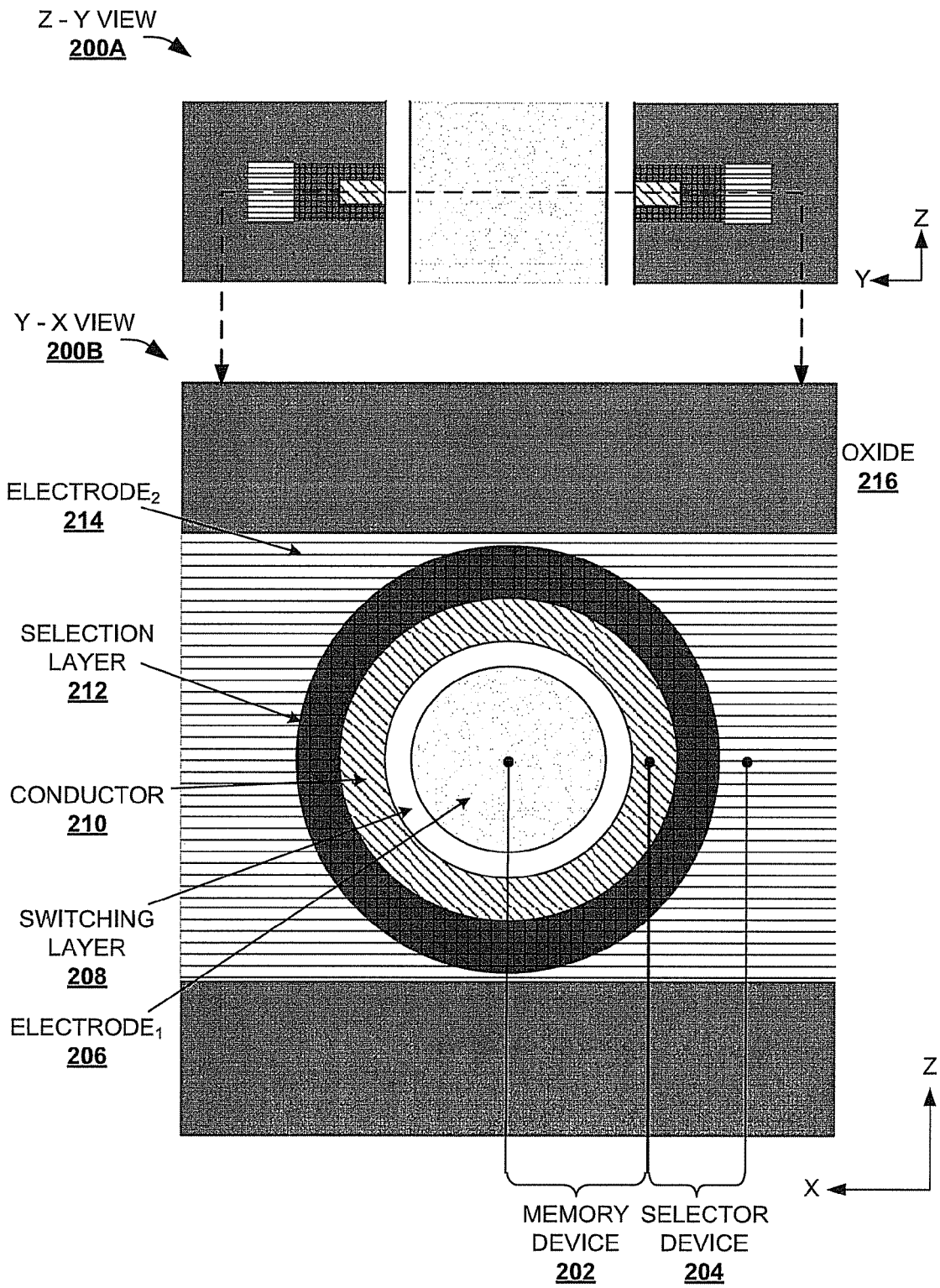
FIG. 2 illustrates a diagram of an example two-terminal memory cell suitable for fabrication in an array, in further embodiments.

FIG. 2 illustrates block diagrams of orthogonal views of a memory cell, according to further disclosed embodiments. In some embodiments, the orthogonal views can include a z-y view 200A and y-x view 200B of one of memory cells 100 of memory architecture 100, supra, although the subject disclosure is not so limited. In further embodiments, memory cells 100 can have different shapes than that depicted by FIG. 2. For instance, x-y plane cross-sections of memory cells 100 can be rectangular in shape in some embodiments, as viewed in x-y view 200A for instance, whereas in other embodiments the x-y plane cross-sections of memory cells 100 can be approximately rectangular, parallelograms or approximate parallelograms, trapezoids or an approximation of a trapezoid, or other suitable cross-section shape, or a suitable combination of the foregoing. In still other embodiments, cross-sections of memory cells 100 can have no regular geometric shape, or can have an irregular geometric shape (e.g., where components of memory cells 100 have different cross-sectional dimensions from other layers, where one or more layers have non-uniform sides or edges, or have rounded or curved corners, and so on). Likewise, viewed from the y-x plane of y-x view 200B, cross-sections of memory cells 100 can be circular or approximately circular in some embodiments, polygonal or approximately polygonal in other embodiments, ovoid or approximately ovoid in further embodiments, or other suitable geometry or approximation thereof in additional embodiments, or in still other embodiments can have an irregular geometry, or no defined or uniform geometric shape. Accordingly, the geometric shapes disclosed in the cross-section views depicted throughout the drawings and described in this Specification should not be deemed limiting; rather, other suitable arrangements, orientations or geometries known to one of skill in the art, or made known by way of the context provided herein, are considered within the scope of the present disclosure.

Referring to y-x view 200B, the depicted memory cell can comprise a memory device 202 and a selector device 204. Memory device 202 and selector device 204 can be surrounded at least in part by an oxide 216.

Memory device 202 can comprise a first electrode, electrode$_1$ 206, a switching layer 208, and a conductor 210. Memory device 202 can be a non-volatile memory device, in various embodiments, that can switch from a first state to second state in response to an applied signal (e.g., a program signal), and maintain the second state in absence of the applied signal. In the context of a resistive-switching memory (e.g., a conductive filamentary based device), electrode$_1$ 206 can provide particles that, in response to the applied signal, migrate or form (e.g., via tunneling, etc.) within switching layer 208, and form a conductive path(s) or filament(s) through at least a subset of switching layer 208. The conductive path(s)/filament(s) can thereby reduce electrical resistance of switching layer 208 and memory device 202 (e.g., between electrode$_1$ 206 and conductor 210). In some embodiments, the particles can in part migrate/form within switching layer 208 or particles within switching layer 208 can be ionized to form the conductive path(s)/filament(s) in response to the applied signal. Furthermore, in response to a second signal, the conductive path(s)/filament(s) can at least in part deform or become non-ionized, changing memory device 202 to a high resistance state.

Selector device 204 can comprise conductor 210, a selection layer 212 and a second electrode, electrode$_2$ 214. Selector device 204 can be a volatile switching device, in various embodiments. According to these embodiments, selection layer 212 can have an intrinsic characteristic that can be changed to a second characteristic measurably distinct from the intrinsic characteristic in response to an applied stimulus. Physical properties of the characteristics and the applied stimulus can vary based on technology employed for selector device 204 (e.g., materials utilized for conductor 210, selector 212, or electrode$_2$ 214). In at least one embodiment, selector device 204 can be a volatile resistive switching device. In this embodiment(s), selection layer 212 can have an intrinsic electrical resistance that can be changed to a second electrical resistance in response to a suitable applied stimulus (e.g., a voltage meeting or exceeding a threshold voltage, a current meeting or exceeding a threshold amperage, a joule heating meeting or exceeding a threshold heat or energy, a field meeting or exceeding a threshold field magnitude, or the like, or a suitable combination of the foregoing).

As an illustrative example, in response to a voltage meeting or exceeding a threshold voltage associated with selector device 204, particles from electrode$_2$ 214 (in response to a bias applied to electrode$_2$ 214) can migrate within or ionize within selection layer 212, forming a conductive path(s)/filament(s) within selector 212 and changing selector 212 from a high resistance to a high conductance (e.g., between electrode$_2$ 214 and conductor 210). Because selector 212 is a volatile switching device, the conductive path(s)/filament(s) can at least in part deform (e.g., disassociate, migrate toward electrode$_2$ 214, become non-ionized, etc.) in response to the voltage dropping below the threshold voltage associated with selector device 204.

In further embodiments, selector device 204 can be a bipolar switching device. In these embodiments, selector device 204 can become highly conductive in response to a second stimulus (e.g., having a different polarity than applied to electrode$_2$ 214 discussed above, in the electrical context) at conductor 210 relative to electrode$_2$ 214. In some embodiments, conductor 210 can be an isolated (e.g., floating) conductor, that is not connected to an external power supply, for instance. In these embodiments, a stimulus is not applied directly to conductor 210. Rather, conductor 210 can have a stimulus associated therewith in response to a stimulus applied to electrode$_2$ 214 or electrode$_1$ 206. For example, if a voltage is applied between electrode$_1$ 206 and electrode$_2$ 214 such that electrode$_1$ 206 is at a lower potential than electrode$_2$ 214, a moderate potential can form at conductor 210 (e.g., having a magnitude between that of electrode$_1$ 206 and electrode$_2$ 214). In this way, conductor 210 can facilitate or modulate a potential across selection layer 212. Continuing this example in the context of a resistive switching selector device 204, particles of conductor 210 can migrate or ionize within selector 212 (e.g., in response to the higher potential at electrode$_2$ 214 and moderate potential at conductor 210) to form a conductive path(s)/filament(s)) in response to the second applied stimulus meeting or exceeding an associated second threshold magnitude (e.g., a second threshold voltage of negative polarity, compared with the threshold voltage applied at electrode$_2$ 214). Again, because selector 212 is volatile, the conductive path(s)/filament(s) can then deform or become non-ionized in the absence of the second applied stimulus having the second threshold magnitude. In some embodiments, the threshold magnitude of the applied stimulus and the second applied stimulus can be the same or approximately the same, whereas in other embodiments the respective threshold magnitudes can be different. In some embodiments, materials for conductor 210, selector 212 or electrode$_2$ 214 can be selected (e.g., see FIG. 3, infra) at least in part to achieve a target threshold magnitude or second threshold magnitude.

In another embodiment, the volatile switching in the selector device 204 can be due to an electrical soft-breakdown of selection layer 212 in response to an electric field across selection layer 212 exceeding a soft-breakdown field threshold of selection layer 212. As mentioned above, an electric field in selection layer 212 can be determined by voltages applied to electrode$_1$ 206 and electrode$_2$ 214.

The bipolar operation of selector device 204 can be suitable for operation in conjunction with a bipolar memory device 202. For instance, a bipolar selector device 204 can significantly reduce leakage current for a resistive-switching memory cell in response to relatively small (e.g., lower than an associated threshold magnitude) positive or negative voltages. Thus, selector device 204 can mitigate leakage current, in the bipolar context, for program operations resulting in a positive parasitic voltage on the resistive-switching memory cell, or erase operations resulting in a negative parasitic voltage on the resistive-switching memory cell. This can provide a significant advantage in a 1T–nR memory architecture comprised of bipolar resistive-switching memory cells, even for large values of n. A positive or negative voltage exceeding an associated threshold voltage of selector device 204 can activate selector device 204 to become conducting. In some disclosed embodiments, selector 212 can have a higher conductance than switching layer 208 when activated, so that the positive/negative voltage drops primarily across memory device 202. Thus, when selector device 204 is activated, the voltage can be configured to perform a memory operation on memory device 202. When selector device 204 is deactivated (electrically resistive), memory device 202 is insulated from the memory operation, whether a positive program operation or a negative erase operation.

FIG. 3 illustrates a block diagram of an example memory cell 300 according to further embodiments of the subject disclosure. Memory cell 300 can comprise a set of material layers that can be fabricated as part of a monolithic process (e.g., as a back-end-of-line process) in some disclosed embodiments. In further embodiments, memory cell 300 can be arranged (e.g., stacked) along a direction that is non-perpendicular to a top surface of an insulated substrate. The direction can be at an oblique angle to a normal vector of the top surface, in further embodiments. In still other embodiments, the direction can be perpendicular to, or approximately perpendicular to the normal vector. In yet other embodiments, the direction can be selected from a range of angles between about parallel to the normal vector and about perpendicular to the normal vector. Additional examples of orientations for memory cell 300 can be found with reference to U.S. patent application Ser. No. 14/194,499, filed Feb. 28, 2014, or with reference to U.S. patent application Ser. No. 14/588,202, filed Dec. 31, 2014; each of which are commonly owned by the assignee of the present application for patent, and incorporated by reference herein in their entireties and for all purposes.

Memory cell 300 can comprise a memory device 302 and a selector device 310. In various embodiments, memory device 302 can be electrically in series with selector device 310. In some disclosed aspects, memory device 302 or selector device 204 can be substantially similar to memory device 202 or selector device 204, respectively, of FIG. 2, infra. However, the subject disclosure is not limited to these aspects.

Memory device 302 can comprise a first contact 304 and a switching material 306. In at least one embodiment, memory device 302 can also comprise a conductor 308 adjacent to switching material 306. In another embodiment, first contact 304 can comprise a bitline of a memory device, or other suitable metal conductor (e.g., wordline, dataline, sourceline, and so forth). First contact 304 can be an active metal, in some embodiments. In other embodiments, first contact 304 can be W, Ti, Cu, Al, Ag, Cu, Pt, Pd, Ta, Ni, Cr, a metal nitride, TiN, TaN, or the like, or a suitable combination of the foregoing. Switching material 306 can comprise an amorphous Si (a-Si), a non-stoichiometric oxide, TiOx, AlOx, HfOx, SiOx, TaOx, CuOx, NbOx, an intrinsic semiconductor material, a chalcogenide, a suitable alloy of the foregoing, or the like, or a suitable combination of the foregoing.

Selector device 310 can comprise a select material 312 and a second contact 314, and in at least one embodiment can comprise conductor 308. Select material 312 can be a volatile switching device having non-linear activation response (e.g., a non-linear current-voltage response), in some embodiments. For instance, select material 312 can comprise an a-Si, a non-stoichiometric oxide, SiOx, TiOx, AlOx, HfOx, WOx, TixNyOz, HfOx, SiOx, TaOx, CuOx, NbOx, an intrinsic semiconductor material, a chalcogenide, an alloy of the foregoing, or the like, or a suitable combination of the foregoing, where x, y and z can be suitable non-stoichiometric values. In other embodiments, select material 312 can be a chalcogenide or a solid-electrolyte material containing one or more of Ge, Sb, S, or Te. In yet another embodiment, select material 312 can comprise a stack of a plurality of the above mentioned materials (e.g., SiOx/GeTe, TiOx/AlOx). In at least one embodiment of the present disclosure, select material 312 can be doped with a metal(s) during fabrication, e.g., to facilitate metal ion injection from conductor 308 or second contact 314.

According to alternative or additional embodiments, second contact 314 can be provided by a conductive line of a memory device, e.g., a wordline, bitline, source line, dataline, etc. In further embodiments, second contact 314 can include a noble metal (e.g., Ag, Pd, Pt, Au, etc.) or a metal alloy at least in part comprising a noble metal (e.g., Ag—Al, Ag—Pd—Cu, Ag—W, Ag—Ti, Ag—TiN, Ag—TaN, and so on). A noble metal or alloy thereof can be utilized to mitigate chemical interaction or ionic bonding between second contact 314 and select material 312. Mitigated chemical interaction can facilitate improved longevity and reliability for selector device 310, as one example. In further embodiments, second contact 314 can include a material with relatively fast diffusing particles. For instance, the material can comprise particles having relatively high mobility to or among defect sites within selector material 312, such as voids or gaps in molecular material thereof. Fast diffusing particles can facilitate fast activation/deactivation of selector device 310, in some embodiments, and at lower bias values in further embodiments. Examples of suitable fast diffusing materials can comprise Ag, Cu, Au, Co, Ni, Al, Fe, or the like, suitable alloys thereof, or a suitable combination of the foregoing.

In a further embodiment, conductor 308 can comprise a material selected from those described above for second contact 314. In at least one embodiment, conductor 308 can comprise the same or substantially the same material as second contact 314. In further embodiments, conductor 308 and second contact 314 can comprise different materials. In still other embodiments, conductor 308 and second contact 314 can be at least in part the same material, and in part different materials. For instance, conductor 308 could comprise a suitable conductive material, and second contact 314 could comprise an alloy of the suitable conductive material, or the suitable conductive material in combination with another suitable conductor, as one example. In at least one additional embodiment, memory cell 300 can comprise no conductor 308, and switching material 306 can be adjacent to select material 312. In another embodiment, conductor 308 can be a stack of multiple materials. Materials employed for the stack of multiple materials can be selected at least in part on material(s) or switching characteristics of memory device 302 or selector device 310. As one example, if memory device 302 is configured for operation with TiN ions and selector device 310 is configured for operation with Ag ions, conductor 308 can comprise a stack of TiN and Ag.

In alternative or additional embodiments of the subject disclosure, memory cell 300 can comprise one or more additional layers or materials in addition to those depicted. For instance, memory cell 300 can include a barrier layer (e.g., that blocks oxygen or reactive gas) or a passivation layer (e.g., that prevents chemical bonding of one or more depicted layers) between one or more layers of memory cell 300. In another embodiment, memory cell 300 can comprise a layer to demote or promote migration of ions across layer boundaries, as suitable. In at least one embodiment, memory cell 300 can comprise fewer layers than depicted by FIG. 3.

Figure 4:
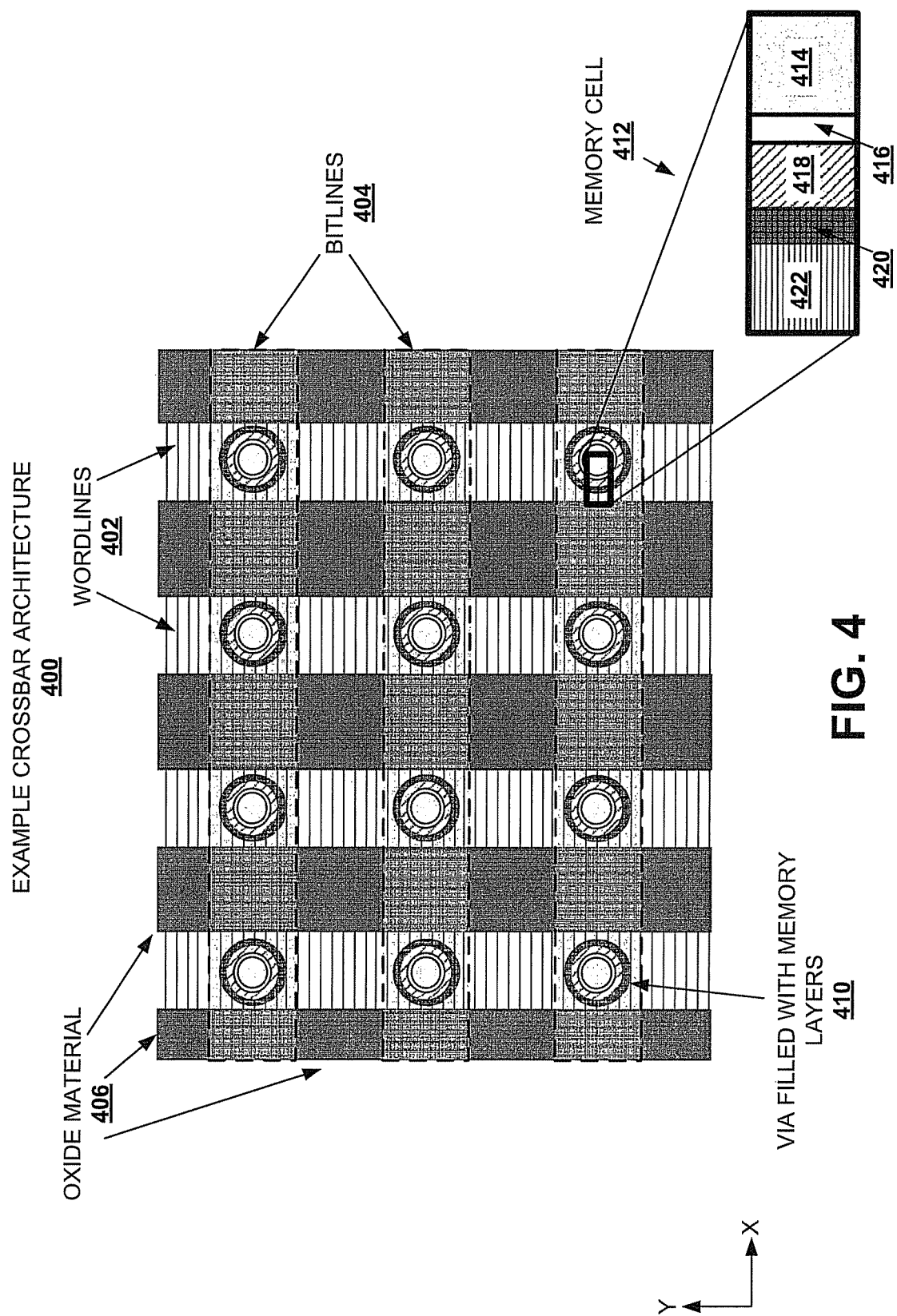
FIG. 4 illustrates a block diagram of an example array of two-terminal memory cells fabricated in part with a via etch, in other embodiments.

FIG. 4 illustrates a block diagram of an example crossbar memory array 400, according to one or more additional embodiments. In at least one embodiment, crossbar memory array 400 can be a top-down view (e.g., a y-x view along the z axis) of memory architecture 100, or other disclosed memory architecture. However, the subject disclosure is not limited to this embodiment(s).

Crossbar memory array 400 can comprise a set of wordlines 402 (horizontal shaded lines) that extend perpendicular to a set of bitlines 404 (gray shading with dashed outlines). As shown in FIG. 1, infra, set of wordlines 402 can comprise multiple layers of wordlines 402 along the z direction (in or out of the page). Additionally, an oxide material 406 (dark gray shading), or other suitable insulator, can fill at least a subset of space between bitlines 404, and at least a subset of space between wordlines 402. Where one of bitlines 404 overlaps one of wordlines 402, a via can be formed comprising layers of memory cells, as depicted at via filled with memory layers 410.

A cutout of a memory cell 412 is depicted at the lower right of FIG. 4. Memory cell 412 can be substantially similar to memory cell 300 in some embodiments, although the subject disclosure is not limited to these embodiments. For instance, memory cell 412 can comprise a first contact 414 comprising a portion of one of bitlines 404. A switching material layer 416 can be adjacent to first contact 414. Switching material layer 416 can comprise a non-volatile filamentary-based switching device, in one or more disclosed embodiments. In at least one embodiment, a conductor 418 can be positioned adjacent to switching material layer 416. Further, a volatile switching layer 420 can be positioned between conductor 418 and a second contact 422. In some embodiments, second contact 422 can comprise one of wordlines 402, or an electrical contact with one of wordlines 402. In other embodiments, first contact 414 can comprise one of bitlines 404, or an electrical contact with one of bitlines 404. In a further embodiment(s), positions of switching layer 416 and selection layer 420 can be swapped. In such embodiment(s), first electrode 414 can be one of wordlines 402 and second electrode 422 can be one of bitlines 404 (e.g., where bitlines 402 are swapped with wordlines 404 in an alternate memory architecture).

Figure 5:
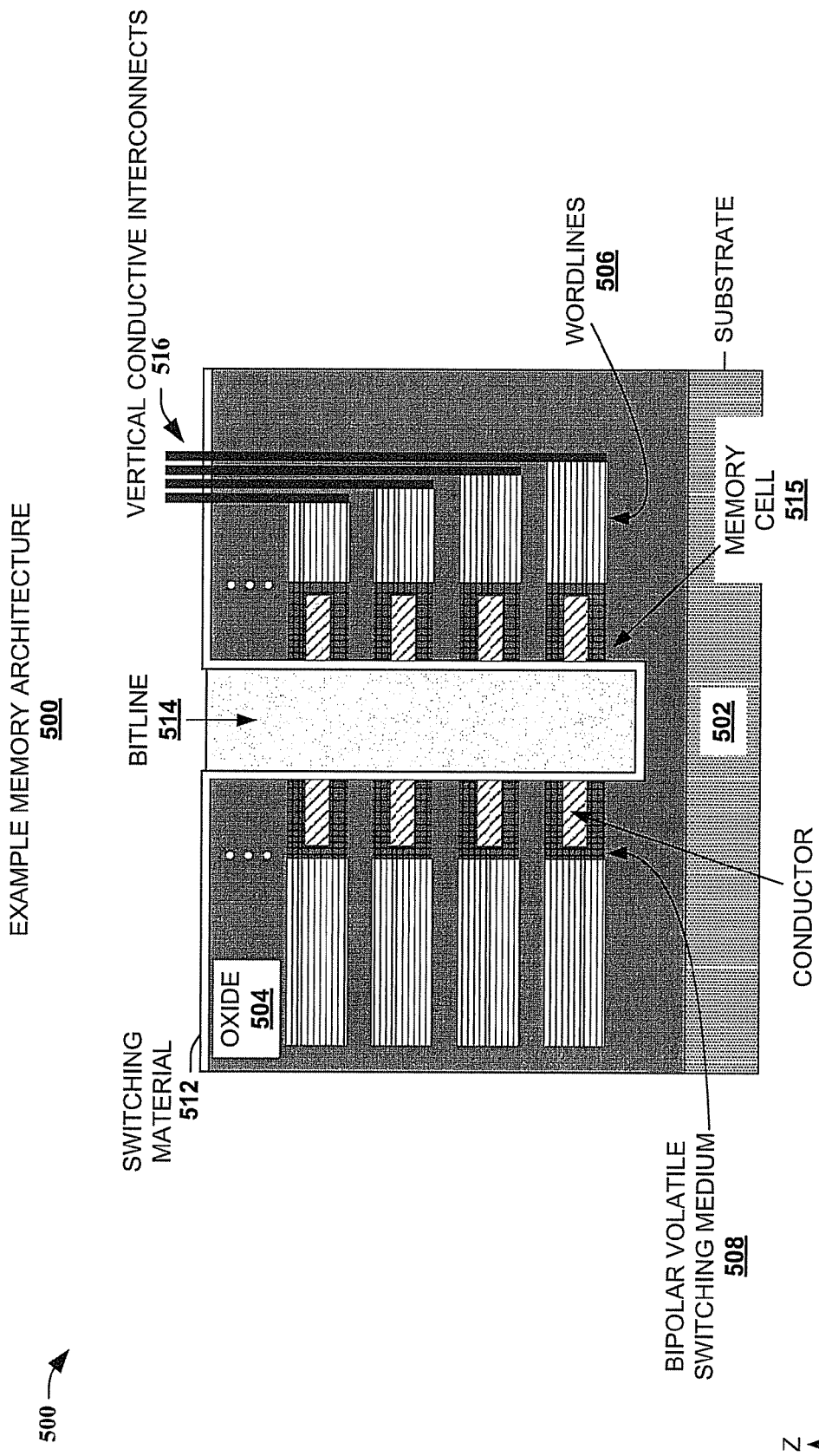
FIG. 5 depicts a block diagram of a sample side-view of a memory device providing electrical control of respective wordlines, in another embodiment(s)

FIG. 5 illustrates a block diagram of an example memory architecture 500 according to further embodiments. In some embodiments, memory architecture 500 can facilitate independent control over respective wordlines of a stack of multiple wordlines 506 above a substrate 502. In conjunction with individual control over respective bitlines 514 of a set of bitlines, memory architecture 500 can facilitate fine control—as small as single cell addressability—for memory operations.

Memory architecture 500 comprises a substrate 502 having an oxide 504 above substrate 502. Oxide 504 can be provided above substrate 502 as a single block, which can be etched and recess etched to form other components of memory architecture 500, in one embodiment(s). In other embodiments, oxide 504 can be provided in layers interspersed with one or more other components of memory architecture 500, at least some of which can be patterned prior to providing layers above them in another embodiment(s).

Two sets of wordlines 506 are illustrated on opposite sides of a via comprising switching material 512 and bitline 514. Sets of wordlines 506 respectively comprise multiple individual wordlines stacked in the z axis of FIG. 5 (e.g., a vertical direction). Sets of memory cells 515 can be formed adjacent to respective ones of sets of wordlines 506, or a subset thereof in some embodiments. Respective memory cells 515 can comprise respective ones of sets of wordlines 506, respective subsets of switching material 512 and bitline 514, in at least one embodiment. In other embodiments, one or more of memory cells 515 can comprise respective selector devices, as described herein.

A set of vertical conductive interconnects 516 can be formed in memory architecture 500, according to one or more embodiments. Respective ones of vertical conductive interconnects 516 can be in electrical contact with respective ones of sets of wordlines 506. Accordingly, applying an electrical signal to one of vertical conductive interconnects 516 can result in the electrical signal being propagated to an associated one of sets of wordlines 506. Accordingly, by applying a voltage at bitline 514 and one (or more) of vertical conductive interconnects 516, a target signal (e.g., a memory operation signal) can be applied to a target one(s) of the memory cells 515 associated with the one (or more) of vertical conductive interconnects 516. Further, a deactivation voltage configured to mitigate or avoid a non-target memory cell(s) 515 being affected by the target signal can be applied at one (or more) of vertical conductive interconnects 516 associated with the non-target memory cell(s) 515. In other embodiments, at least a subset of vertical conductive interconnects 516 can be routed to or into substrate 502 depending on an interconnection scheme of an associated memory chip architecture.

Based on the foregoing, memory architecture 500 can be configured to provide flexible control over numbers of memory cells selected for a memory operation. For instance, memory architecture 500 can facilitate individual addressability, in some embodiments. In other embodiments, memory architecture 500 can facilitate addressing a single word, double word, a page, a subset of a page, a block, a subset of a block, or the like, or a suitable combination thereof. For instance, where memory architecture 500 comprises resistive-switching memory cells, a single word, page, double word, etc. can be programmed, erased or written. In the context of non-volatile memory structures, this can provide significant advantage over other systems limited to page write, block erase, and so forth.

FIGS. 6A through 6F depict block diagrams related to fabrication of a memory architecture according to additional embodiments of the present disclosure. For instance, the fabrication can comprise a via etch process that incorporates, or is provided in conjunction with, one or more recess etch processes to form a layer of memory cells in one embodiment. In another embodiment, the etch process and recess etch process(es) can form multiple layers of memory cells in a vertical arrangement.

Figure 6A:
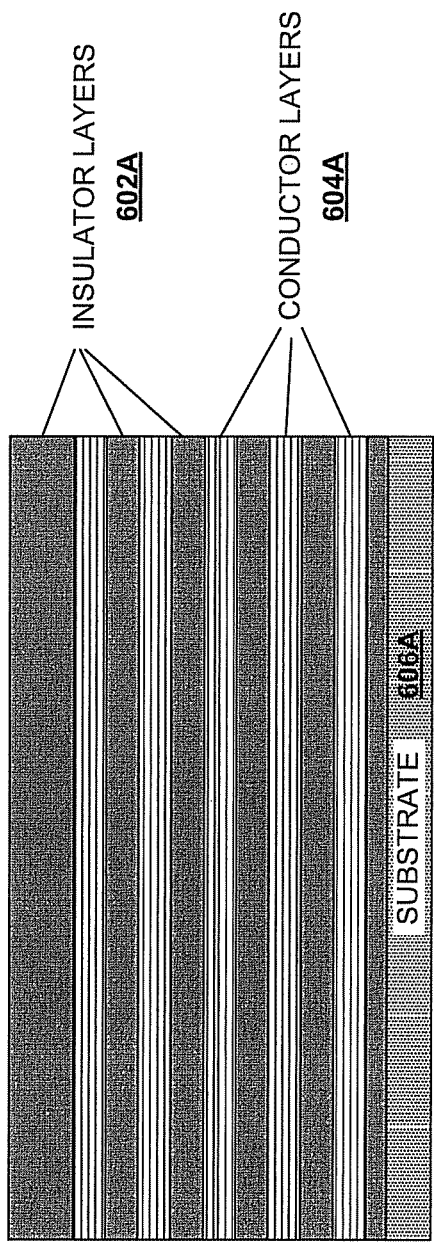
FIGS. 6A through 6F depict block diagrams of a sample process(es) comprising a recess etch for fabricating a memory device in additional embodiments.

Referring to FIG. 6A, a substrate 606A is provided. Substrate 606A can be a semiconductor material, such as Si or other suitable substrate material with CMOS circuits, in some embodiments. Above substrate 606A is an insulator layer 602A (e.g., an oxide, or other suitable electrical insulator material), depicted by gray shading. Above insulator layer 602A is a conductor layer 604A, depicted by horizontal lines. In some embodiments, multiple sets of insulator layers 602A interspersed between conductor layers 604A can be provided. Conductor layer(s) 604A can be wordlines of a memory architecture, in various embodiments.

Figure 6B:
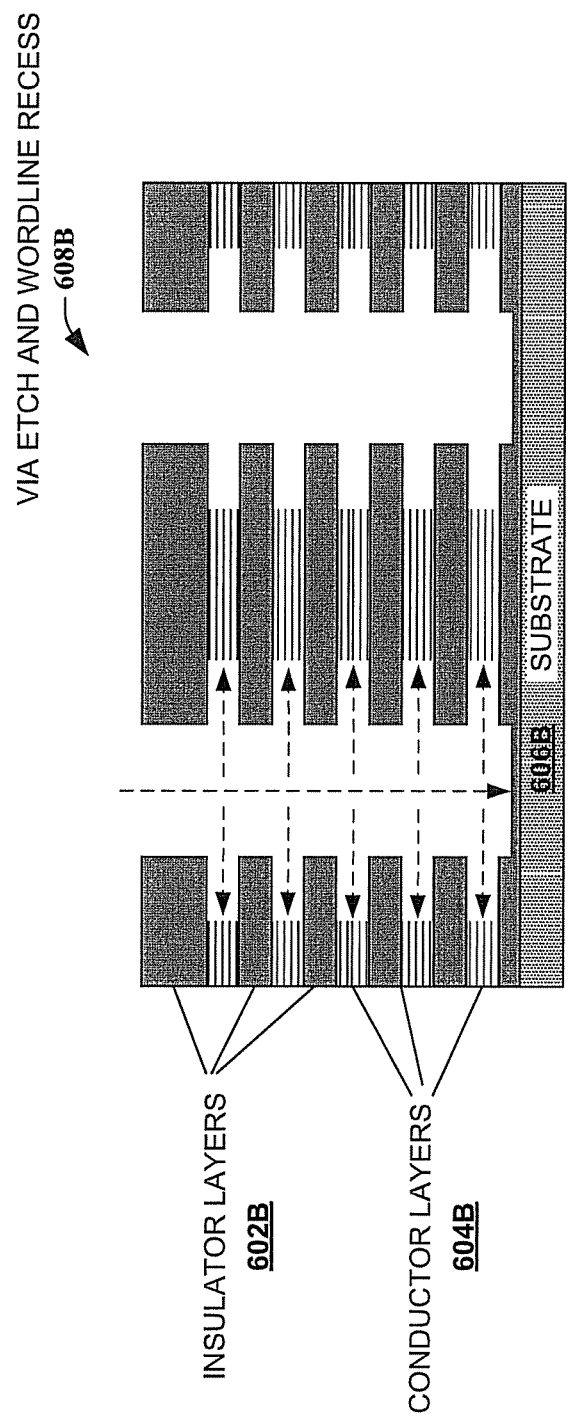

FIG. 6B depicts a stack of multiple insulator layers 602B interspersed with respective conductor layers 604B, over substrate 606B. A via etch and wordline recess etch 608B removes insulator material and conductor material above substrate 606B. In at least one embodiment, the via etch does not extend to substrate 606B, leaving at least some insulator layer 602B material on top of substrate 606B at the bottom of the via etches (e.g., to the down dashed arrows). Via etch and wordline recess etch 608B can additionally remove conductor layer 604B material laterally, left and right from width of the via etch, as depicted by horizontal dashed arrows. The recess etch can be provided as part of the via etch in a combined etch process, in one embodiment. In other embodiments, the recess etch can be performed to laterally remove conductor layer 604B material subsequent to the via etch. After via etch and wordline recess etch 608B is complete, vertical vias are created in the stack of multiple insulator layers 602B interspersed with respective conductor layer 604B, and lateral recesses are created in the respective conductor layers 604B, leaving subsets of empty space between respective insulator layers 602B.

Figure 6C:
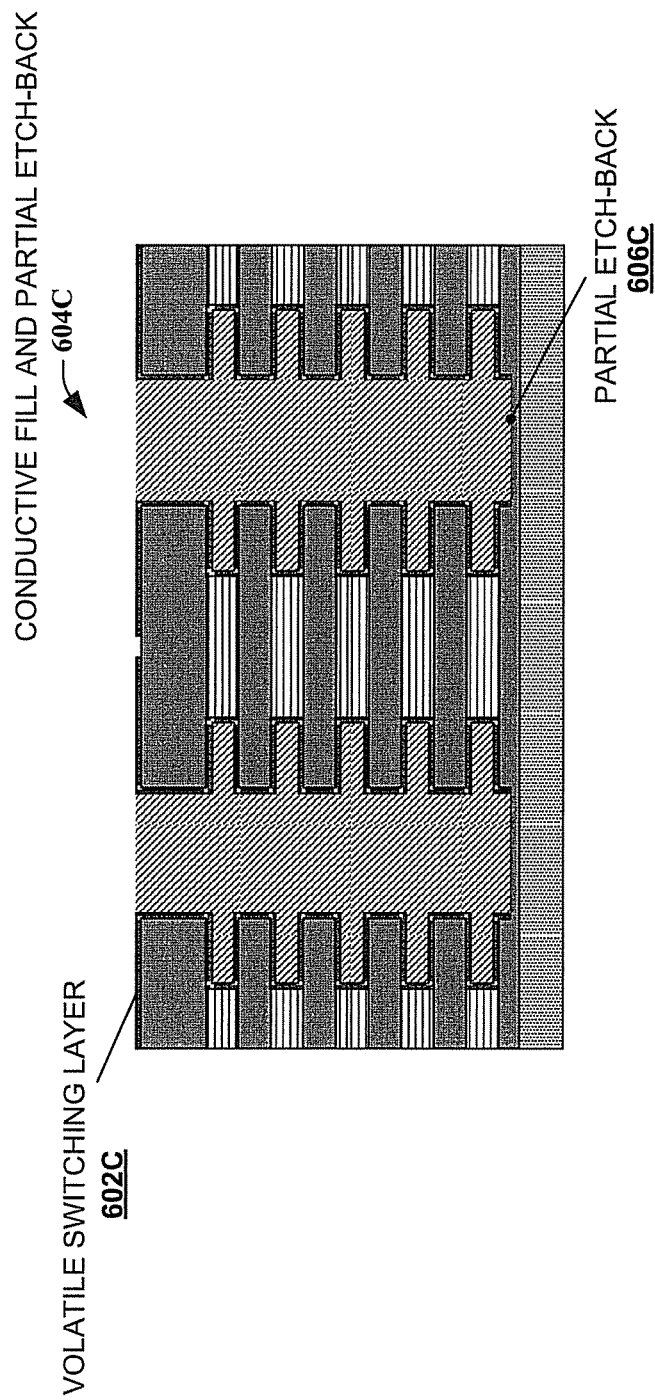

At FIG. 6C, a switching layer 602C is deposited over surfaces exposed by the via etch and wordline recess etch of 608B. Switching layer 602C can be deposited as a thin film, in various embodiments. Accordingly, switching layer 602C can be relatively thin, e.g., having a thickness selected from between about 1 nm and about 20 nm, in some embodiments. In another embodiment, switching layer 602C can be removed from a bottom of the via etch, just above the substrate, as depicted at partial etch-back 606C. After depositing switching layer 602C, the remaining via and recess etch can be filled with conductive material. In an embodiment, the conductive material can be substantially similar to conductor 308 of FIG. 3, supra.

Figure 6D:
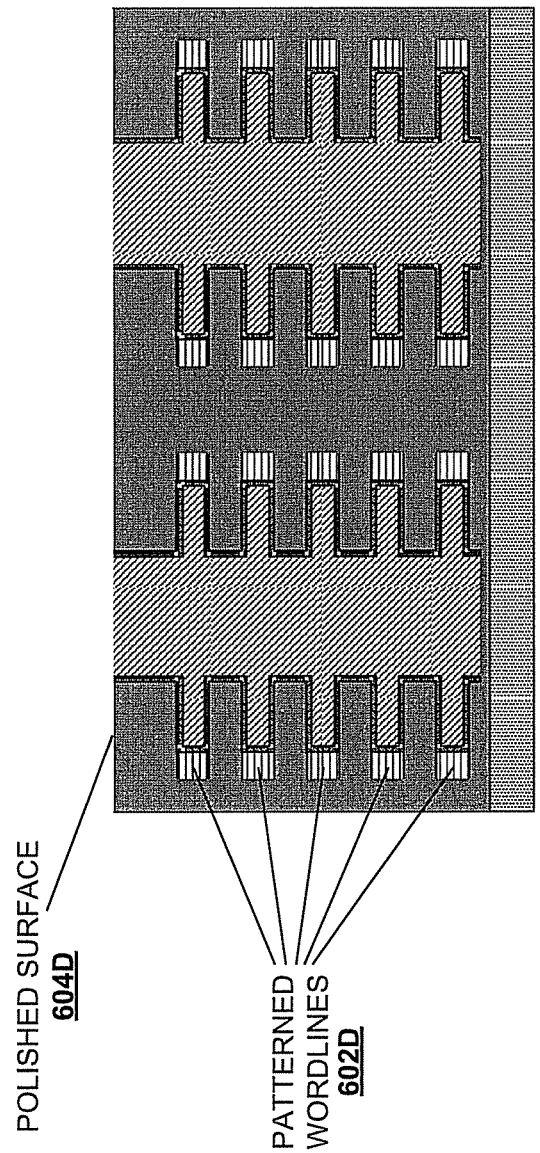

At FIG. 6D, wordlines 602D can be patterned from conductor layers. In at least one embodiment, a line etch can be performed down through conductor layers (e.g., the conductor layers 604B of FIG. 6B) of the memory architecture. The gaps between the etched conductors can be back-filled with oxide or another suitable insulator material to electrically isolate respective ones of the patterned wordlines 602D from others thereof. Additionally, a top surface can be polished 604D (e.g., chemical mechanical polish [CMP], etc.) to remove switching layer 602C material from the top surface, and to level conductive material and oxide along the top surface of the memory architecture.

Figure 6E:
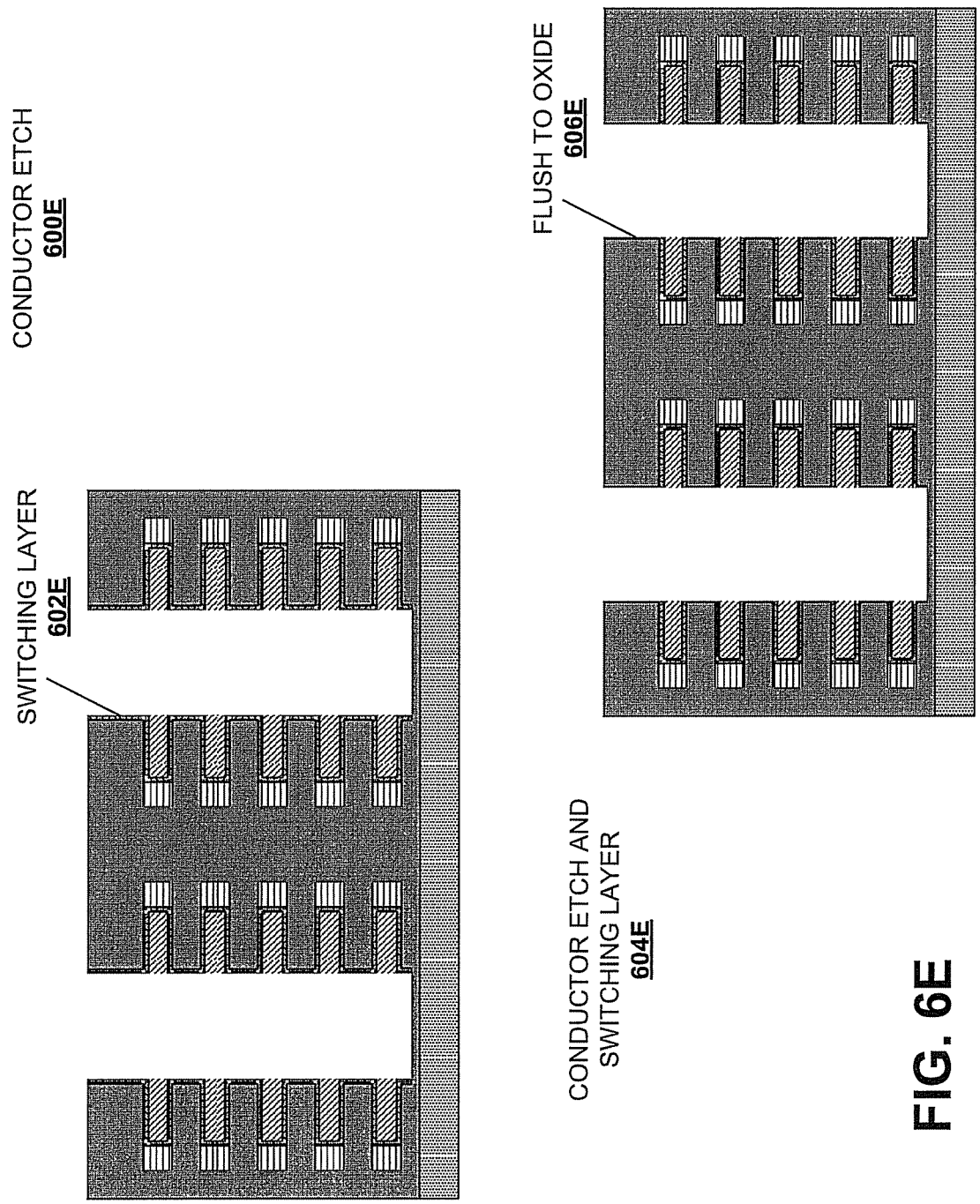

FIG. 6E illustrates alternative embodiments for etching the conductor material. In a first embodiment, conductor etch 600E can remove conductor material down to a bottom of oxide, and in some embodiments, can leave oxide above the substrate. Conductor etch 600E can leave switching layer 602E on an inner diameter of conductor etch 600E, according to this embodiment. In an alternative embodiment, a conductor etch and switching layer etch 604E can remove conductor material flush to oxide 606E.

Figure 6F:
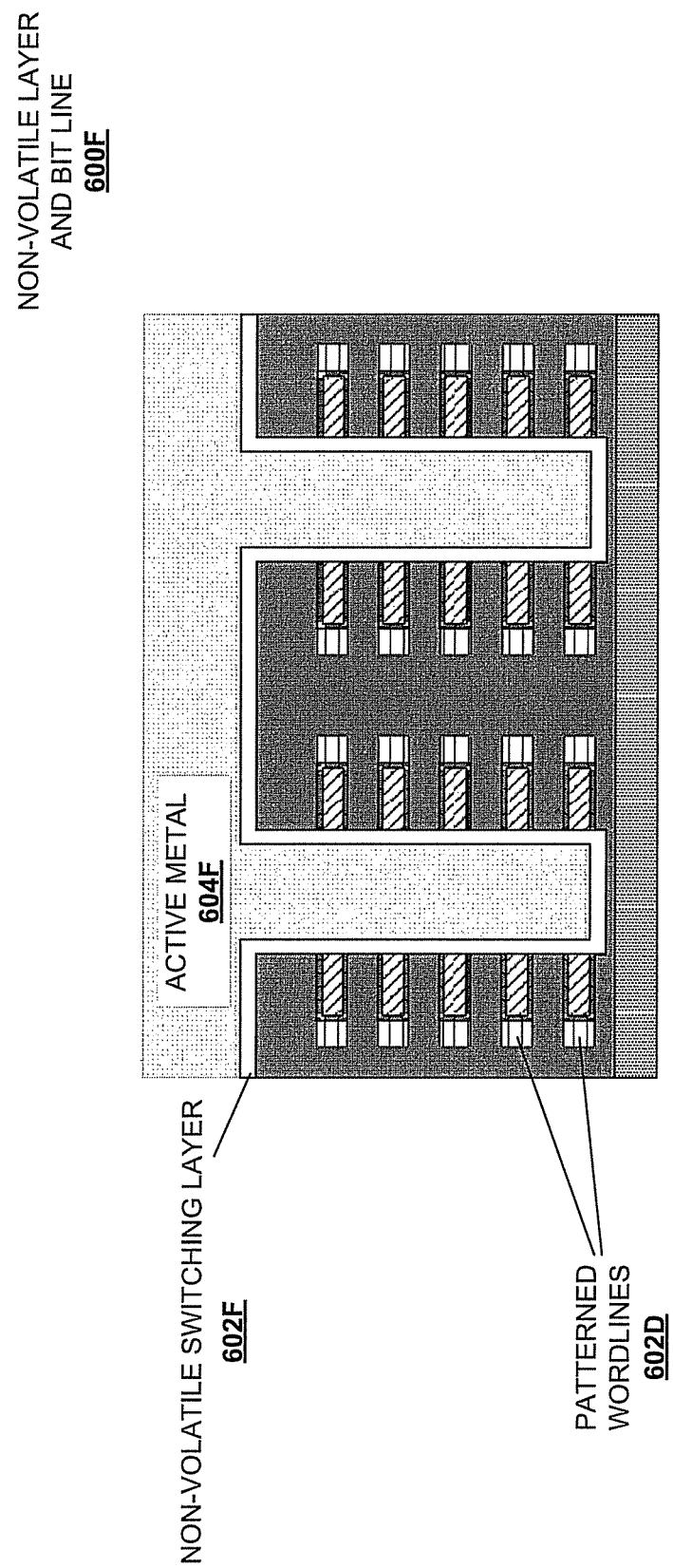

FIG. 6F depicts formation of a non-volatile layer and bitline 600F. A non-volatile switching layer 602F is formed as a film over surfaces exposed by conductor etch 600E. Respective subsets of non-volatile switching layer 602F can therefore be adjacent to respective ones of conductor materials within the recess etches formed at FIGS. 6C and 6B, respectively. An active metal 604F is filled into at least a subset of the remaining area exposed by conductor etch 600E. In one embodiment, active metal 604F can fill the entire remaining space, and form or be in contact with a bitline above a top surface of non-volatile switching layer 602F. Accordingly, regions of the memory architecture between one of the patterned wordlines 602D and bitline 604F comprise a memory cell. In various embodiments, the memory cell can be substantially similar to memory cell 300 of FIG. 3, supra; whereas in other embodiments, the memory cell can be another disclosed memory cell, or can be a variation thereof known to one of ordinary skill in the art, or made known to one of ordinary skill by way of the context provided herein.

Figure 7:
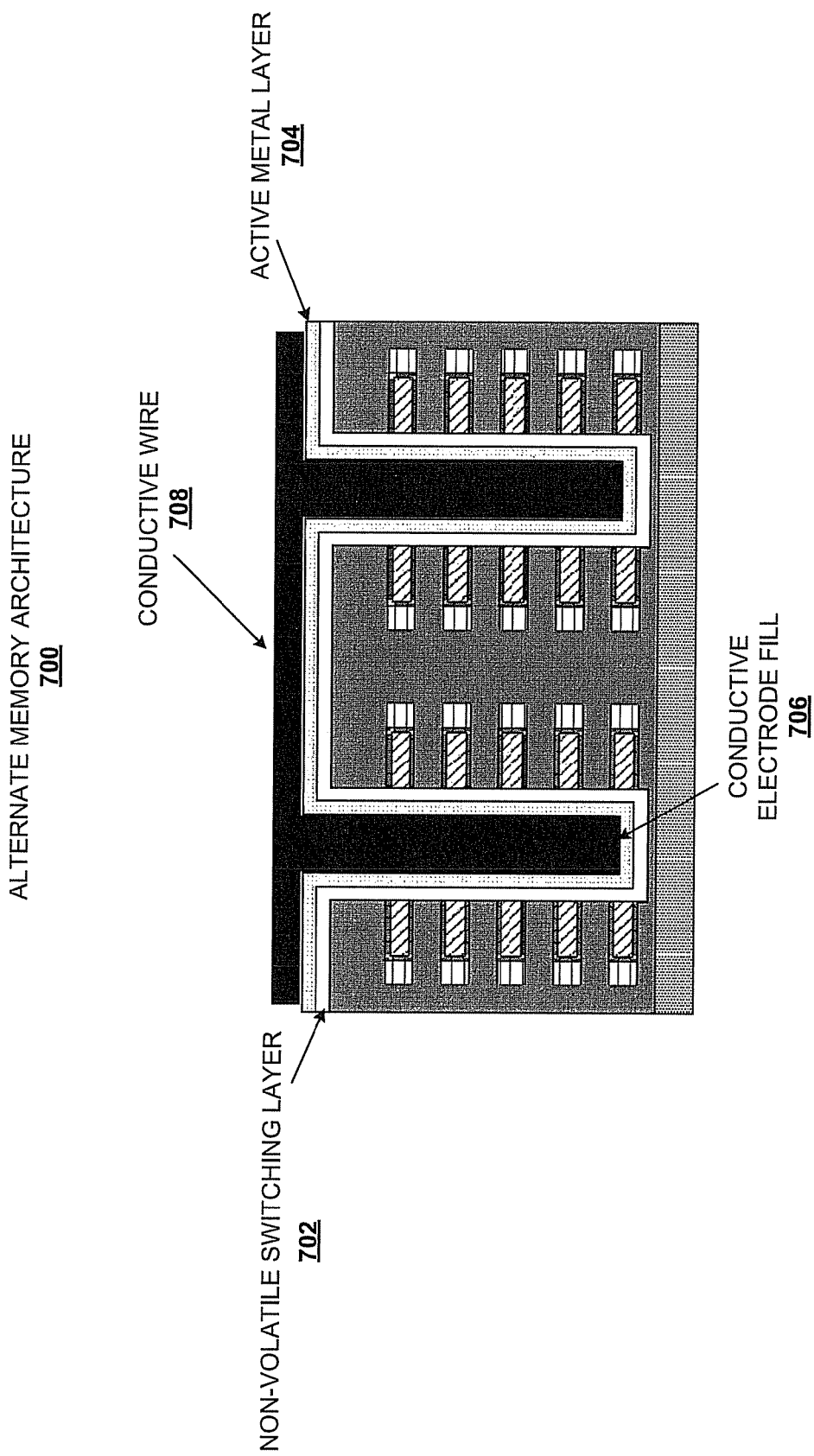
FIG. 7 depicts a block diagram of an alternative memory device according to disclosed processes.

FIG. 7 illustrates an alternative memory architecture 700 according to additional embodiments of the present disclosure. Memory architecture 700 can be substantially similar to the memory architecture fabricated according to the processes of FIGS. 6A through 6E. Thus, memory architecture 700 can have stacks of patterned wordlines and recess etches, layered with volatile switching material and conductive material. A non-volatile switching layer 702 can be deposited over surfaces exposed by a conductor etch, removing material between filled recess etches. Non-volatile switching layer 702 can extend over at least a portion of a top surface of memory architecture 700, over an oxide material (dark gray) of memory architecture 700. Additionally, an active metal layer 704 can be deposited over non-volatile switching layer 702. Depositing of active metal layer 704 can be an alternative to filling remaining space of the conductive etch with active metal layer 704. Instead, remaining empty space after depositing of active metal layer 704 can be filled with a conductive wire material, which an include W, Ti, Cu, Al, Ag, Cu, Pt, Pd, Ta, Ni, Cr, a metal nitride, TiN or TaN, or the like, or a suitable combination (e.g., alloy, etc.) thereof.

Figure 8:
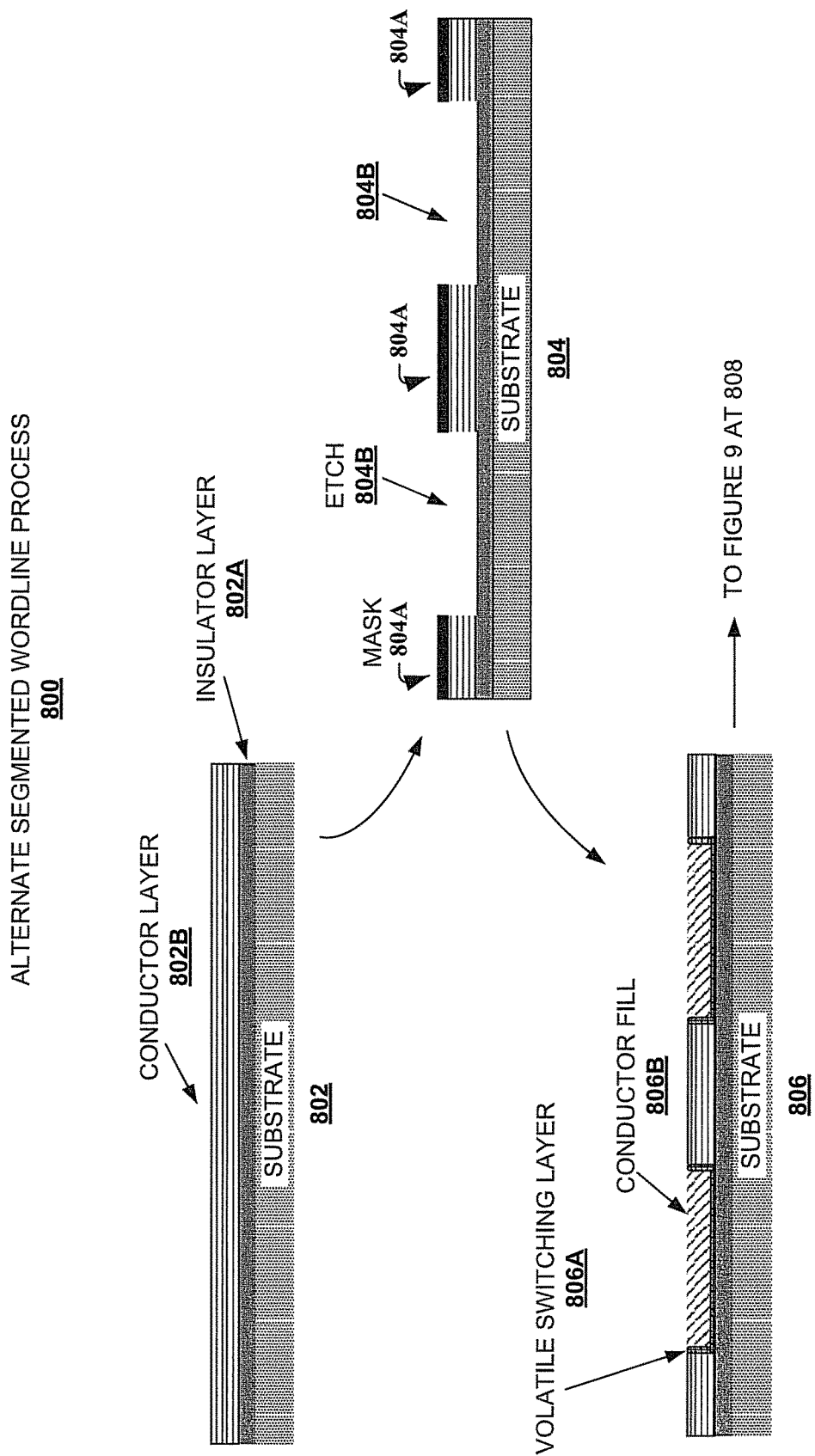
FIGS. 8 and 9 illustrate block diagrams of an alternative process(es) comprising a recess etch(es) for fabricating a memory device, in an embodiment(s)

FIG. 8 illustrates an alternate segmented wordline process 800 for fabricating a memory device, according to further embodiments of the present disclosure. Alternate segmented wordline process 800 can comprise a pattern and etch process of a conductor layer(s). The pattern and etch process, repeated for a stack of alternating conductor and insulator layers, can provide a memory device having patterned wordlines (e.g., broken, or segmented wordlines).

At 802, a substrate is provided, and an insulator layer 802A formed over the substrate, and conductor layer 802B formed over the insulator layer 802A. At 804, a one or more masks 804A can be provided over regions of conductor layer 802B to be retained for wordline patterns. An etch 804B can be performed to remove conductor material at least to insulator layer 802A. In some embodiments, etch 804B can remove at least a portion of insulator layer 802A, whereas in other embodiments etch 804B can stop at insulator layer 802A, leaving insulator layer 802A intact. At 806, a volatile switching layer 806A can be deposited over the surfaces exposed by etch 804B, and a conductor fill 806B can fill remaining space removed by etch 804B.

Figure 9:
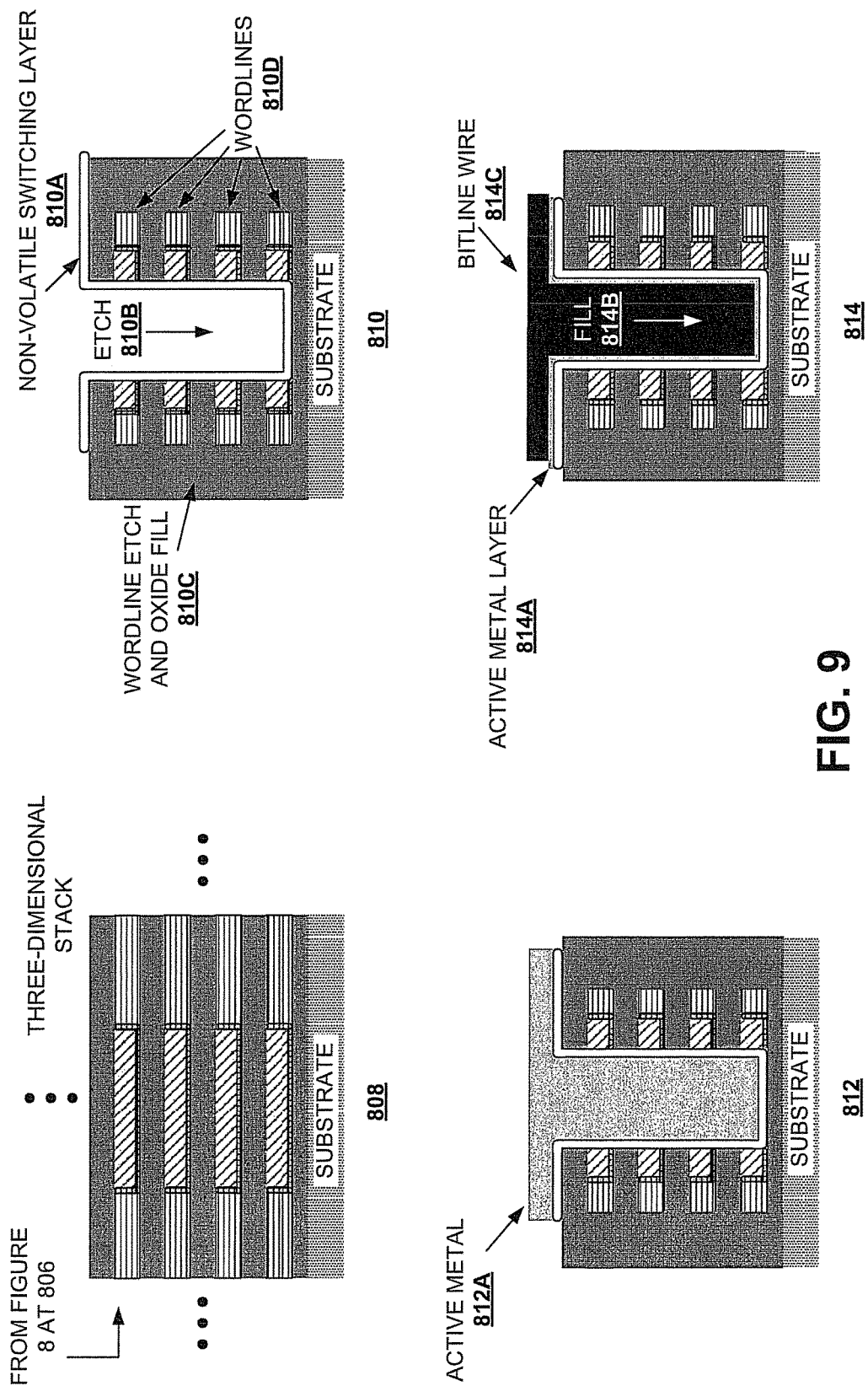

Referring to FIG. 9, alternate segmented wordline process 800 is continued from 806 of FIG. 8. At 808, steps 802, 804 and 806 can be repeated for additional insulator/conductor layers, to achieve a stack of alternating insulator layers and patterned conductor layers. At 810, a pattern and etch step can form an etch 810B through the stack of insulator and patterned conductor layers. A non-volatile switching layer 810A can be deposited over surfaces of the stack of insulator and patterned conductor layers exposed by etch 810B.

Additionally, a wordline etch 810C can and oxide fill can be performed to form distinct and electrically isolated wordlines 810D.

At 812 and 814, alternate embodiments are provided for completing the memory device of alternate segmented wordline process 800. At 812, an active metal 812A can fill remaining space opened by etch 810B. Active metal 812A can form a bitline or a subset of a bitline of the memory device. In an alternate embodiment, at 814, active metal layer 814A can be deposited over non-volatile switching layer 810A. A fill 814B can be performed within the remaining spaced opened by etch 810B over active metal layer 814A, the fill 814B comprising bitline wire material 814C.

Alternate segmented wordline process 800 can provide a memory device having segmented, or broken, wordlines and a recess etch formed by mask and pattern as an alternative to the via etch of FIGS. 6A through 6F. The recess etch can be filled with switching material layers, and multiple patterned wordlines can be created to form a vertical stack of patterned wordlines and memory cell layers. A final pattern and etch can be utilized to provide a non-volatile memory layer and second contact or bitline for respective memory cells.

The aforementioned diagrams have been described with respect to interaction between several components (e.g., layers) of a memory cell, components thereof (e.g., memory component, selector component, etc.), or a memory architecture comprised of such memory cell or components. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. As another example, a particle or ion mitigation layer can be positioned to mitigate migration of particles of one layer entering an adjacent layer. As yet another example, a passivation layer can be positioned between one or more disclosed layers, to mitigate chemical bonding of particles of respective layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 10-14. While for purposes of simplicity of explanation, the methods of FIGS. 10-14 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification (or, e.g., instructions for automating an apparatus, machine or computer, etc., to perform a step(s) of such methods) are capable of being stored on an article of manufacture to facilitate transporting and transferring such methods to an electronic device. The term article of manufacture, as used, is intended to encompass a computer program accessible from any computer-readable device, device in conjunction with a carrier, or storage medium.

Figure 10:
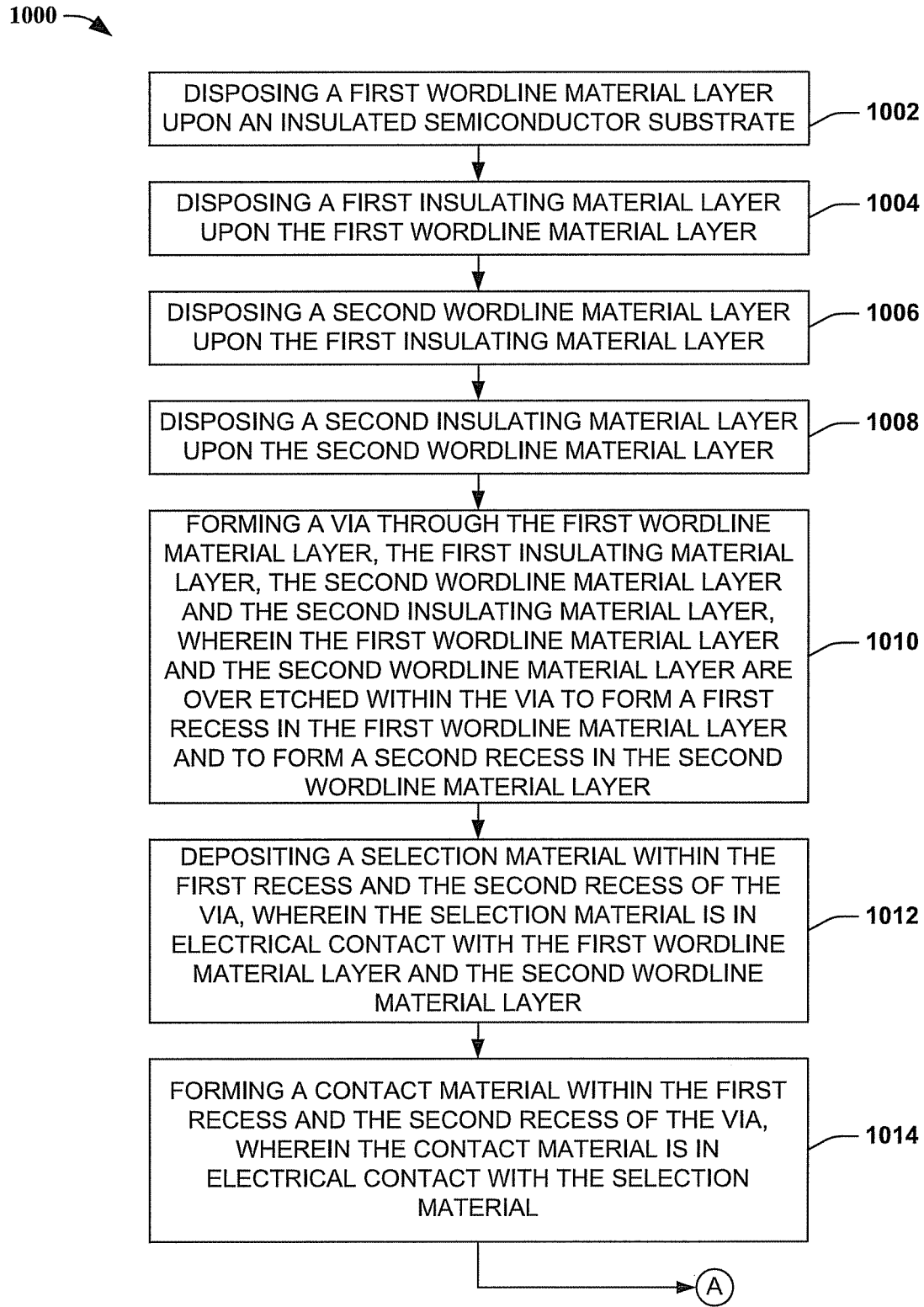
FIGS. 10 and 11 depict a flowchart of a sample method for providing a memory array according to one or more further embodiments.
Figure 11:
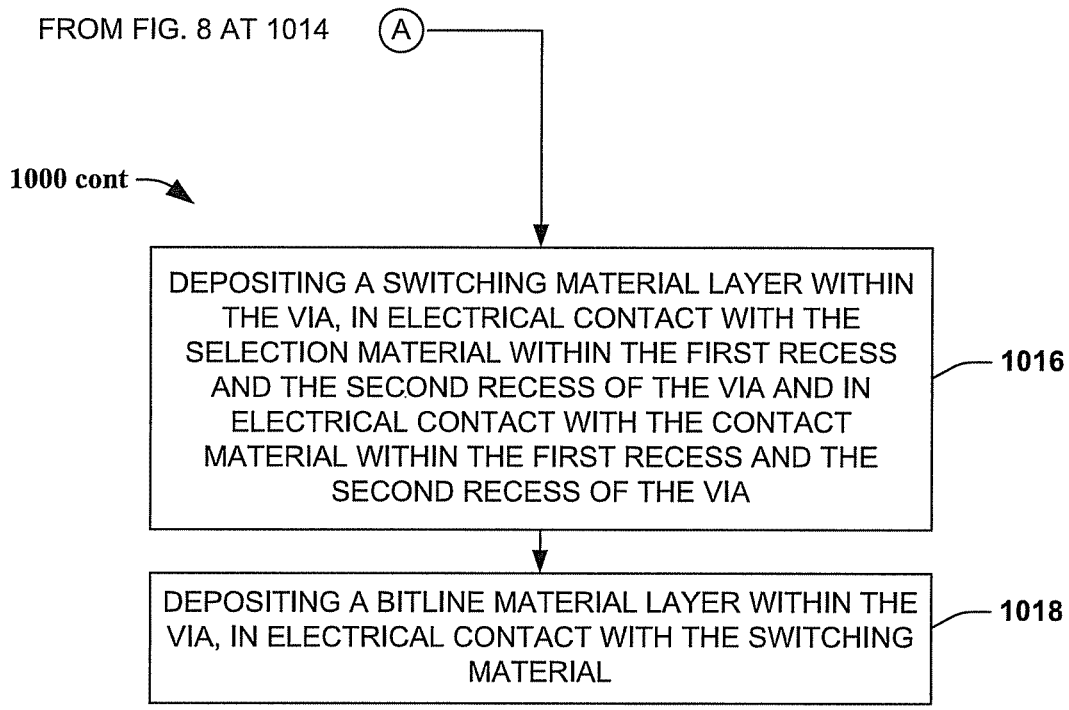

FIGS. 10 and 11 illustrate a flowchart of an example method 1000 for providing a memory architecture according to a monolithic fabrication process, according to alternative or additional aspects of the present disclosure. In some embodiments, the monolithic fabrication process can be formed on a substrate comprising one or more CMOS devices, and within a thermal budget of the CMOS devices. In alternative or additional embodiments, the monolithic fabrication process can be performed utilizing back-end-of-line fabrication processes.

At 1002, method 1000 can comprise disposing a first wordline material layer upon an insulated semiconductor substrate. At 1004, method 1000 can comprise disposing a first insulating material layer upon the first wordline material layer. At 1006, method 1000 can comprise disposing a second wordline material layer upon the first insulating material layer. In addition to the foregoing, at 1008, method 1000 can comprise disposing a second insulating material layer upon the second wordline material layer.

Further to the above, method 1000 can comprise, at 1010, forming a via through the first wordline material layer, the first insulating material layer, the second wordline material layer and the second insulating material layer. In some embodiments, the first wordline material layer and the second wordline material layer can be over-etched within the via (e.g., laterally past a horizontal dimension, or width, of the via). In further embodiments, the over-etch within the via can form a first recess in the first wordline material layer and forms a second recess in the second wordline material layer.

At 1012, method 1000 can comprise depositing a selection material within the first recess and the second recess of the via. In an embodiment(s), respective subsets of the selection material can be in electrical contact with the first wordline material layer and the second wordline material layer. At 1014, method 1000 can comprise forming a contact material within the first recess and the second recess of the via. In further embodiments, the contact material can be in electrical contact with the selection material. Method 1000 continues on FIG. 11, at 1016.

Referring now to FIG. 11, at 1016, method 1000 can comprise depositing a switching material layer within the via. In an embodiment, the switching material layer can be in contact with the selection material within the first recess and the second recess of the via. In a further embodiment, the switching material layer can be in electrical contact with the contact material within the first recess and the second recess of the via. In another embodiment, a combination of the foregoing can be achieved (e.g., the switching material layer is in contact with the contact material and the selection material within the first recess or the second recess of the via). At 1018, method 1000 can comprise depositing a bitline material layer within the via in electrical contact with the switching material.

In an embodiment, the method 1000 can further comprise, prior to depositing the selection material, etching the first wordline material layer, the first insulating material layer, the second wordline material layer and the second insulating material layer. The etching prior to depositing the selection material can form a first wordline and a second wordline, in a further embodiment. In still another embodiment, forming the via can further comprise forming the via through the first wordline and the second wordline.

In at least one embodiment of the present disclosure, the insulated semiconductor substrate can comprise a plurality of CMOS devices fabricated therein. In another embodiment, the plurality of CMOS devices can be selected from a group consisting of: a processor, a logic array, a buffer, a bitline controller, a wordline controller and a controller. In a further aspect, the first wordline is coupled to at least a first portion of the plurality of CMOS devices. In another embodiment, method 1000 can further comprise coupling an external memory interface controller to the insulated semiconductor substrate. In still other embodiments, method 1000 can comprise disposing the insulated semiconductor substrate and the external memory interface upon a printed circuit board. In further embodiments, method 1000 can comprise disposing the insulated semiconductor substrate, the external memory interface controller, and the printed circuit board into an enclosure. In yet another embodiment, the printed circuit board can be selected from a group consisting of: a flexible printed circuit board and a rigid printed circuit board. In one or more other embodiments, method 1000 can comprise coupling a visual display to at least a second portion of the plurality of CMOS devices, coupling a wireless communication interface to at least a third portion of the plurality of CMOS devices, coupling a power source to at least a fourth portion of the plurality of CMOS devices, or disposing the insulated semiconductor substrate, the visual display, the wireless communication interface, and the power source within an enclosure.

According to additional embodiments, the method can comprise etching the bitline material layer to form at least a first bitline, wherein the first bitline is approximately orthogonal to or orthogonal to, the first wordline. In another embodiment, the method can comprise coupling the first bitline to a plurality of CMOS devices formed within the insulated semiconductor substrate. In a further embodiment, the CMOS devices can be selected from a group consisting of: a processor, a logic array, a buffer, a bitline driver, a wordline driver and a controller.

In a further embodiment, the first wordline material can be selected from a group consisting of: W, Ti, Cu, Al, Ag, Cu, Pt, Pd, Ta, Ni, Cr, a metal nitride, TiN and TaN. In yet another embodiment, the selection material can comprise a material selected from a group consisting of: an a-Si, a non-stoichiometric oxide, TiOx, AlOx, HfOx, SiOx, TaOx, CuOx, and an intrinsic semiconductor material. In still other embodiments, the contact material can be selected from a group consisting of: W, Ti, Cu, Al, Ag, Cu, Pt, Pd, Ta, Ni, Cr, a metal nitride, TiN, TaN, a conductive semiconductor material, SiGe, doped polycrystalline Si, doped SiGe and Si. In a further embodiment, the switching material layer can comprise a material selected from a group consisting of: a-Si, a non-stoichiometric oxide, TiOx, AlOx, HfOx, SiOx, TaOx, CuOx, and an intrinsic semiconductor material. In still another embodiment, the bitline material layer can be selected from a group consisting of: W, Ti, Cu, Al, Ag, Cu, Pt, Pd, Ta, Ni, Cr, a metal nitride, TiN and TaN.

In one or more further embodiments, method 1000 can comprise depositing a passivating material layer over the top of the bitline material layer. In another embodiment, method 1000 can comprise forming the via in a shape selected from a group consisting of: a cylinder, approximately a cylinder, a rectangular prism, approximately a rectangular prism, a truncated cone and approximately a truncated cone.

In an additional embodiment, method 1000 can comprise forming a first memory device. The first memory device can comprise a portion of the first wordline material layer, the selection material within the first recess of the via, the contact material within the first recess of the via. Additionally, the first memory device can comprise a first portion of the switching material layer within the via and laterally adjacent to the selection material within the first recess of the via and laterally adjacent to the contact material within the first recess of the via. Further, the first memory device can comprise a first portion of the bitline material layer within the via and laterally adjacent to the first portion of the switching material layer. In a further embodiment, method 1000 can comprise forming a second memory device. The second memory device can comprise a portion of the second wordline material layer, the selection material within the second recess of the via, and the contact material within the second recess of the via. Additionally, the second memory device can comprise a second portion of the switching material layer within the via and laterally adjacent to the selection material within the second recess of the via and laterally adjacent to the contact material within the second recess of the via, and a second portion of the bitline material layer within the via and laterally adjacent to the second portion of the switching material layer. In a further embodiment, the second memory device can be vertically stacked relative to the first memory device.

In still another embodiment, method 1000 can comprise, before the forming the via step, forming a third wordline from the first wordline material layer, forming a fourth wordline from the second material layer, and forming a second via through the third wordline and the fourth wordline. In alternative or additional embodiments, the first wordline material layer and the second wordline material layer can be over-etched within the second via to form a third recess in the third wordline and to form a fourth recess in the fourth wordline. In a further embodiment(s), the first wordline can be positioned laterally relative to the third wordline, the second wordline is positioned laterally relatively to the fourth wordline, the second wordline is positioned vertically above the first wordline, and the fourth wordline is positioned vertically above the third wordline.

Figure 12:
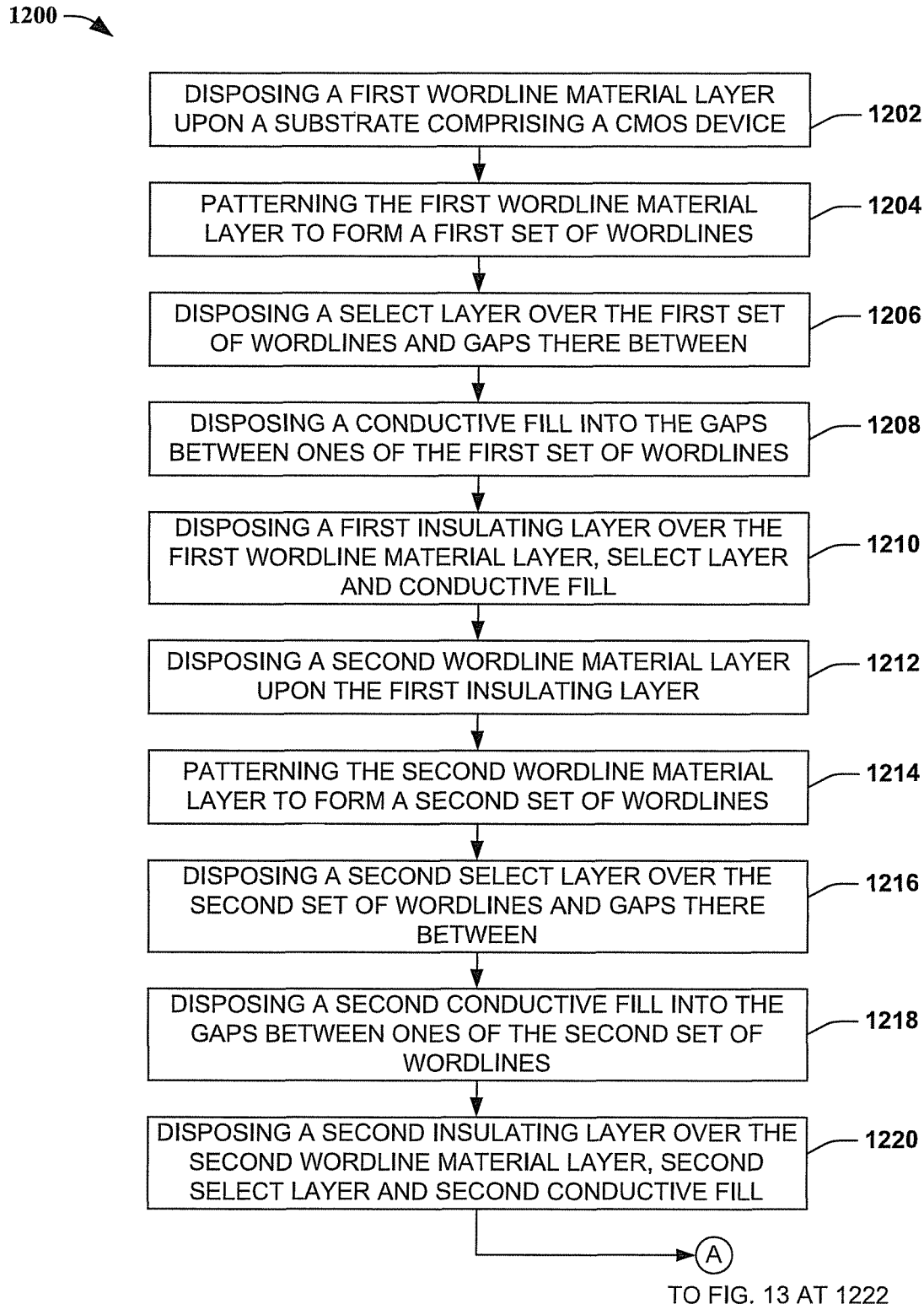
FIGS. 12 to 14 illustrate a flowchart of an alternative or additional method for providing a memory array according to other embodiments.
Figure 13:
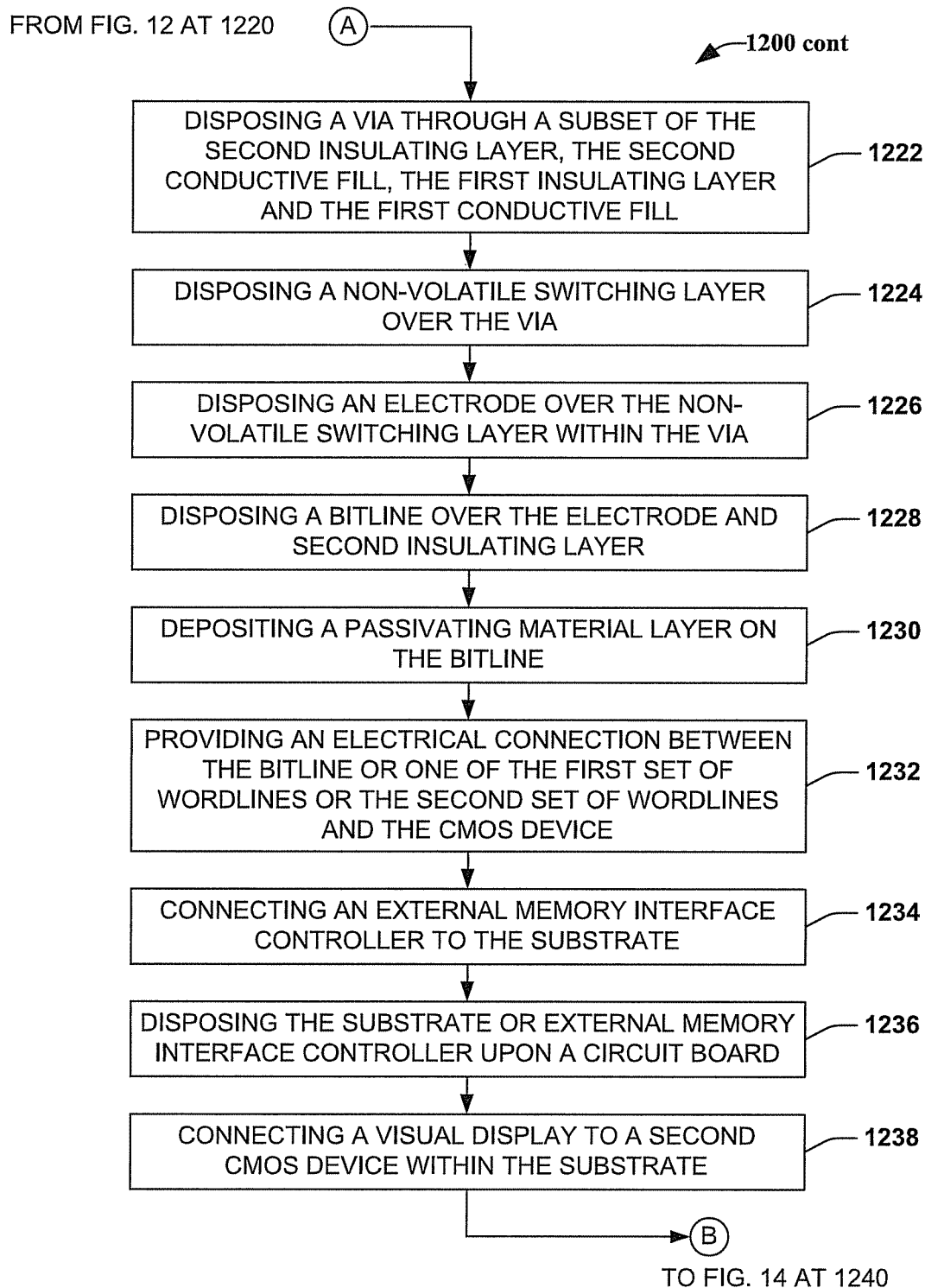
Figure 14:
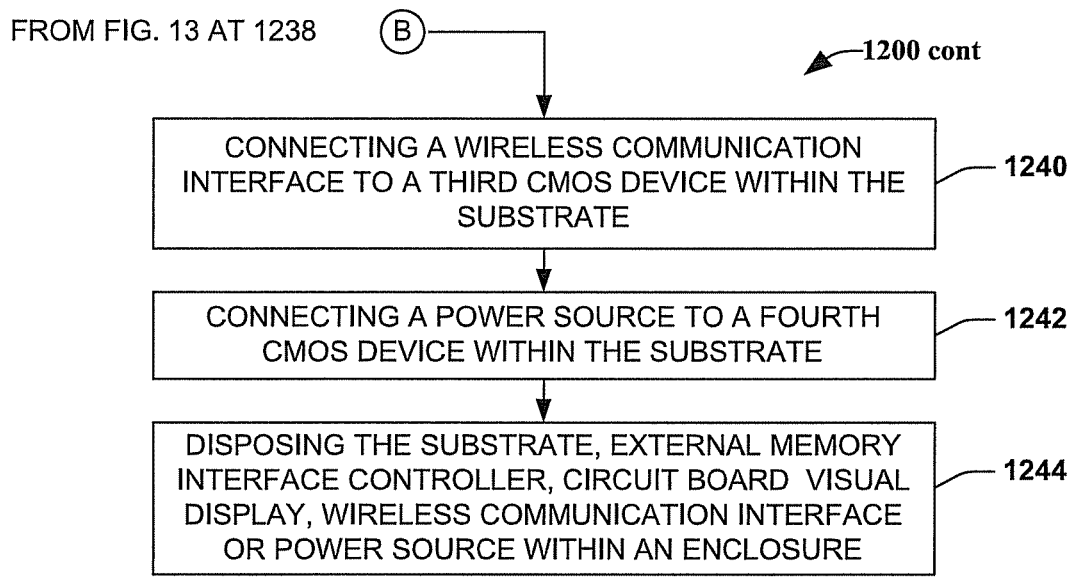

FIGS. 12, 13 and 14 illustrate a flowchart of a sample method 1200 for fabricating a memory device according to further embodiments. At 1202, method 1200 can comprise disposing a first wordline material layer upon a substrate comprising a CMOS device. At 1204, method 1200 can comprise patterning the first wordline material layer to form a first set of wordlines. At 1206, method 1200 can comprise disposing a select layer over the first set of wordlines and gaps there between. At 1208, method 1200 can comprise disposing a conductive fill into the gaps between ones of the first set of wordlines. At 1210, method 1200 can comprise disposing a first insulating layer over the first wordline material layer, select layer and conductive fill.

Further to the above, method 1200 can comprise, at 1212, disposing a second wordline material layer upon the first insulating layer. At 1214, method 1200 can comprise patterning the second wordline material layer to form a second set of wordlines. At 1216, method 1200 can comprise disposing a second select layer over the second set of wordlines and gaps there between. At 1218, method 1200 can comprise disposing a second conductive fill into the gaps between ones of the second set of wordlines.

Additionally, at 1220, method 1200 can comprise disposing a second insulating layer over the second wordline material layer, second select layer and second conductive fill. From 1220, method 1200 can continue at 1222 of FIG. 13.

Referring now to FIG. 13, at 1222, method 1200 can comprise disposing a via through a subset of the second insulating layer, the second conductive fill, the first insulating layer and the first conductive fill. At 1224, method 1200 can comprise disposing a non-volatile switching layer over the via. At 1226, method 1200 can comprise disposing an electrode over the non-volatile switching layer within the via. Further, at 1228, method 1200 can comprise disposing a bitline over the electrode and second insulating layer and at 1230, method 1200 can comprise forming a passivating material layer on the bitline.

At 1232, method 1200 can comprise providing an electrical connection between the bitline and the CMOS device, one of the first set of wordlines and the CMOS device, or the second set of wordlines and the CMOS device, or a suitable combination of the foregoing. At 1234, method 1200 can comprise connecting an external memory interface controller to the substrate. At 1236, method 1200 can comprise disposing the substrate or external memory interface controller upon a circuit board. At 1238, method 1200 can comprise connecting a visual display to a second CMOS device within the substrate. Method 1200 can continue from 1238 to 1240 on FIG. 13.

Referring now to FIG. 13, method 1200 can continue at 1240. For instance, at 1240 method 1200 can comprise connecting a wireless communication interface to a third CMOS device within the substrate. At 1242, method 1200 can comprise connecting a power source to a fourth CMOS device within the substrate. At 1244, method 1200 can comprise disposing the substrate, external memory interface controller, circuit board, visual display, wireless communication interface or power source within an enclosure.

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 14 and 15, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. A subset of these or similar considerations are addressed by the disclosed aspects.

In order to provide a context for the various aspects of the disclosed subject matter, FIG. 14, as well as the following discussion, is intended to provide a brief, general description of a suitable environment in which various aspects of the disclosed subject matter can be implemented or processed. While the subject matter has been described above in the general context of solid state memory and semiconductor architectures and process methodologies for fabricating and operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1502 of FIG. 15, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 14 illustrates a block diagram of an example operating and control environment 1400 for a memory cell array 1402 according to aspects of the subject disclosure. In at least one aspect of the subject disclosure, memory cell array 1402 can comprise a variety of memory cell technology. In at least one embodiment, memory cells of the memory cell technology can comprise two-terminal memory having a non-linear I-V response(s), arranged in a compact two or three dimensional architecture, as described herein. In another embodiment, memory cell array 1402 can store operations configured to cause a device to fabricate a two-terminal memory cell electrically in series with a selector device.

A column controller 1406 can be formed adjacent to memory cell array 1402. Moreover, column controller 1406 can be electrically coupled with bit lines of memory cell array 1402. Column controller 1406 can control respective bitlines, applying suitable program, erase or read voltages to selected bitlines.

In addition, operating and control environment 1400 can comprise a row controller 1404. Row controller 1404 can be formed adjacent to column controller 1406, and electrically connected with word lines of memory cell array 1402. Row controller 1404 can select particular rows of memory cells with a suitable selection voltage. Moreover, row controller 1404 can facilitate program, erase or read operations by applying suitable voltages at selected word lines.

A clock source(s) 1408 can provide respective clock pulses to facilitate timing for read, write, and program operations of row controller 1404 and column controller 1406. Clock source(s) 1408 can further facilitate selection of word lines or bit lines in response to external or internal commands received by operating and control environment 1400. An input/output buffer 1412 can be connected to an external host apparatus, such as a computer or other processing device (not depicted, but see e.g., computer 802 of FIG. 12, infra) by way of an I/O buffer or other I/O communication interface. Input/output buffer 1412 can be configured to receive write data, receive an erase instruction, output readout data, and receive address data and command data, as well as address data for respective instructions. Address data can be transferred to row controller 1404 and column controller 1406 by an address register 1410. In addition, input data is transmitted to memory cell array 1402 via signal input lines, and output data is received from memory cell array 1402 via signal output lines. Input data can be received from the host apparatus, and output data can be delivered to the host apparatus via the I/O buffer.

Commands received from the host apparatus can be provided to a command interface 1414. Command interface 1414 can be configured to receive external control signals from the host apparatus, and determine whether data input to the input/output buffer 1412 is write data, a command, or an address. Input commands can be transferred to a state machine 1416.

State machine 1416 can be configured to manage programming and reprogramming of memory cell array 1402. State machine 1416 receives commands from the host apparatus via input/output buffer 1412 and command interface 1414, and manages read, write, erase, data input, data output, and similar functionality associated with memory cell array 1402. In some aspects, state machine 1416 can send and receive acknowledgments and negative acknowledgments regarding successful receipt or execution of various commands.

To implement read, write, erase, input, output, etc., functionality, state machine 1416 can control clock source(s) 1408. Control of clock source(s) 1408 can cause output pulses configured to facilitate row controller 1404 and column controller 1406 implementing the particular functionality. Output pulses can be transferred to selected bit lines by column controller 1406, for instance, or word lines by row controller 1404, for instance.

In connection with FIG. 15, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 15:
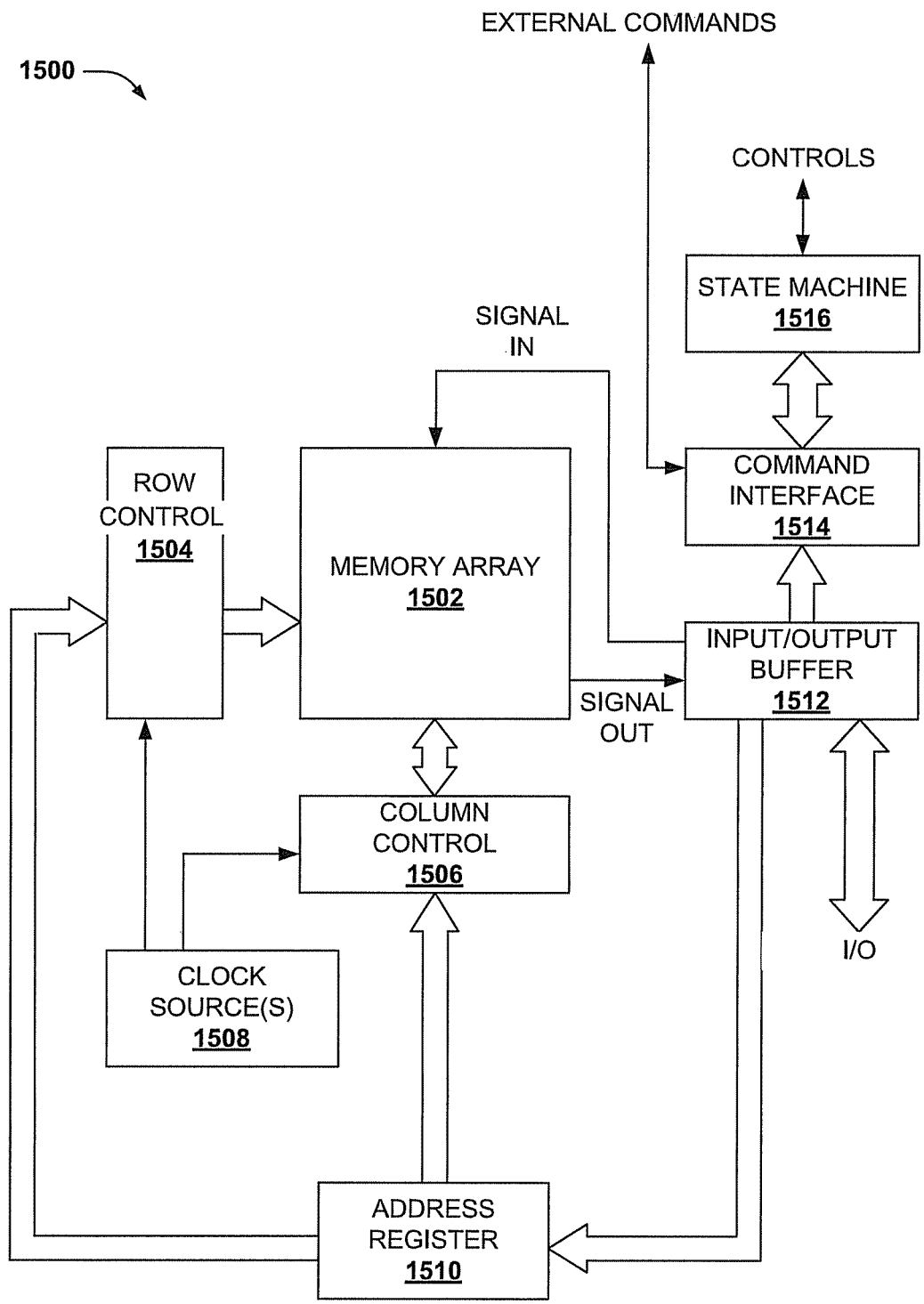
FIG. 15 depicts a block diagram of a sample control system for a memory device according to various disclosed embodiments.
Figure 16:
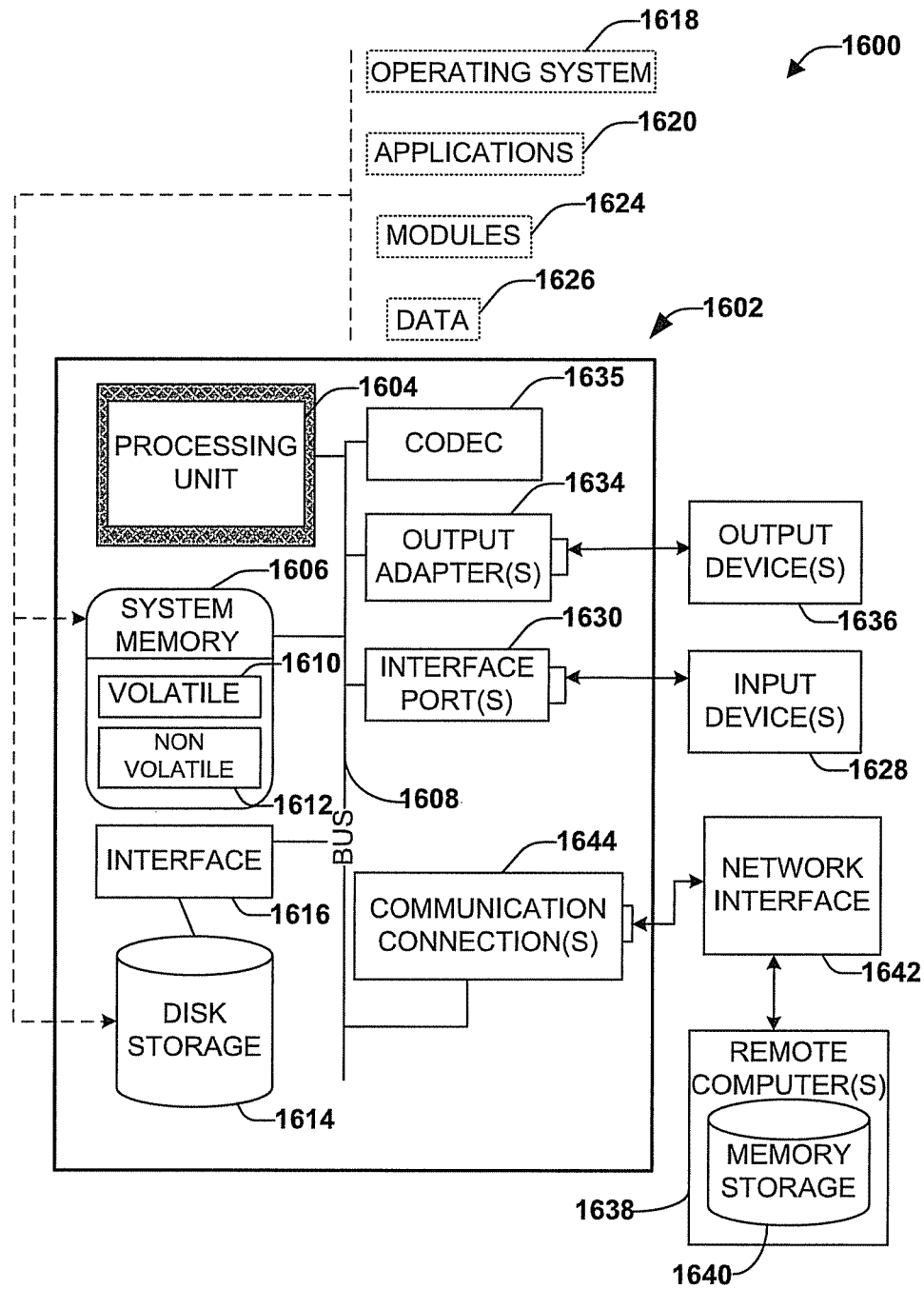
FIG. 16 illustrates a block diagram of an example computing environment that can be implemented in conjunction with various embodiments.

With reference to FIG. 15, a suitable operating environment 1500 for implementing various aspects of the claimed subject matter includes a computer 1502. The computer 1502 includes a processing unit 1504, a system memory 1506, a codec 1535, and a system bus 1508. The system bus 1508 couples system components including, but not limited to, the system memory 1506 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1506 includes volatile memory 1510 and non-volatile memory 1514, which can employ one or more of the disclosed memory architectures, in various embodiments. The basic input/output system (BIOS), containing the basic routines to transfer information between elements within the computer 1502, such as during start-up, is stored in non-volatile memory 1512. In addition, according to present innovations, codec 1535 may include at least one of an encoder or decoder, wherein the at least one of an encoder or decoder may consist of hardware, software, or a combination of hardware and software. Although, codec 1535 is depicted as a separate component, codec 1535 may be contained within non-volatile memory 1512. By way of illustration, and not limitation, non-volatile memory 1512 can include read only memory (ROM), programmable ROM (PROM), electrically programmable ROM (EPROM), electrically erasable programmable ROM (EEPROM), or Flash memory. Non-volatile memory 1512 can employ one or more of the disclosed memory architectures, in at least some disclosed embodiments. Moreover, non-volatile memory 1512 can be computer memory (e.g., physically integrated with computer 1502 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1510 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1502 may also include removable/non-removable, volatile/non-volatile computer storage medium. FIG. 15 illustrates, for example, disk storage 1514. Disk storage 1514 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1514 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1514 to the system bus 1508, a removable or non-removable interface is typically used, such as interface 1516. It is appreciated that disk storage 1514 can store information related to a user. Such information might be stored at or provided to a server or to an application running on a user device. In one embodiment, the user can be notified (e.g., by way of output device(s) 1536) of the types of information that are stored to disk storage 1514 and/or transmitted to the server or application. The user can be provided the opportunity to opt-in or opt-out of having such information collected and/or shared with the server or application (e.g., by way of input from input device(s) 1528).

It is to be appreciated that FIG. 15 describes software that acts as an intermediary between users and the basic computer resources described in the suitable operating environment 1500. Such software includes an operating system 1518. Operating system 1518, which can be stored on disk storage 1514, acts to control and allocate resources of the computer 1502. Applications 1520 take advantage of the management of resources by operating system 1518 through program modules 1524, and program data 1526, such as the boot/shutdown transaction table and the like, stored either in system memory 1506 or on disk storage 1514. It is to be appreciated that the claimed subject matter can be implemented with various operating systems or combinations of operating systems.

A user enters commands or information into the computer 1502 through input device(s) 1528. Input devices 1528 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via interface port(s) 1530. Interface port(s) 1530 include, for example, a serial port, a parallel port, a game port, and a universal serial bus (USB). Output device(s) 1536 use some of the same type of ports as input device(s) 1528. Thus, for example, a USB port may be used to provide input to computer 1502 and to output information from computer 1502 to an output device 1536. Output adapter 1534 is provided to illustrate that there are some output devices, such as monitors, speakers, and printers, among other output devices, which require special adapters. The output adapter 1534 can include, by way of illustration and not limitation, video and sound cards that provide a means of connection between the output device 1536 and the system bus 1508. It should be noted that other devices and/or systems of devices provide both input and output capabilities such as remote computer(s) 1538.

Computer 1502 can operate in a networked environment using logical connections to one or more remote computers, such as remote computer(s) 1538. The remote computer(s) 1538 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1540 is illustrated with remote computer(s) 1538. Remote computer(s) 1538 is logically connected to computer 1502 through a network interface 1542 and then connected via communication connection(s) 1544. Network interface 1542 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1544 refers to the hardware/software employed to connect the network interface 1542 to the system bus 1508. While communication connection 1544 is shown for illustrative clarity inside computer 1502, it can also be external to computer 1502. The hardware/software necessary for connection to the network interface 1542 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for forming a device comprising a three-dimensional memory device comprises:
    disposing a first wordline material layer upon an insulated semiconductor substrate;
    disposing a first insulating material layer upon the first wordline material layer;
    disposing a second wordline material layer upon the first insulating material layer;
    disposing a second insulating material layer upon the second wordline material layer;
    etching the first wordline material layer, the first insulating material layer, the second wordline material layer, and the second insulating material layer to form a first wordline and a second wordline;
    forming a via through the first wordline of the first wordline material layer, the first insulating material layer, the second wordline of the second wordline material layer and the second insulating material layer, wherein the first wordline material layer and the second wordline material layer are over etched within the via to form a first recess in the first wordline material layer and to form a second recess in the second wordline material layer;
    depositing a selection material within the first recess and the second recess of the via, wherein the selection material is in electrical contact with the first wordline material layer and the second wordline material layer;
    forming a contact material within the first recess and the second recess of the via, wherein the contact material is in electrical contact with the selection material;
    depositing a switching material layer within the via, in electrical contact with the selection material within the first recess and the second recess of the via and in electrical contact with the contact material within the first recess and the second recess of the via; and
    depositing a bitline material layer within the via, in electrical contact with the switching material layer.

2. The method of claim 1, wherein:
    the insulated semiconductor substrate comprises a plurality of complementary metal oxide semiconductor (CMOS) devices fabricated therein;
    the plurality of CMOS devices are selected from a group consisting of: a processor, a logic array, a buffer, bitline controller, wordline controller, and a controller;
    the first wordline is coupled to at least a first portion of the plurality of CMOS devices, the method further comprising:
    coupling a visual display to at least a second portion of the plurality of CMOS devices;

coupling a wireless communication interface to at least a third portion of the plurality of CMOS devices;
coupling a power source to at least a fourth portion of the plurality of CMOS devices; and
disposing the insulated semiconductor substrate, the visual display, the wireless communication interface, and the power source within an enclosure.

3. The method of claim 2, further comprising disposing the insulated semiconductor substrate upon a circuit board, wherein the circuit board is selected from a group consisting of: a flexible printed circuit board, and a rigid printed circuit board.

4. The method of claim 1, wherein at least one of:
the first wordline material layer comprises a first material selected from a group consisting of: W, Ti, Cu, Al, Ag, Cu, Pt, Pd, Ta, Ni, Cr, a metal nitride, TiN, TaN, and an alloy of the foregoing;
the selection material comprises a second material selected from a second group consisting of: an amorphous silicon, a non-stoichiometric oxide, TiOx, AlOx, HfOx, SiOx, TaOx, CuOx, NbOx, an intrinsic semiconductor material, chalcogenide, and alloy of the foregoing;
the contact material comprises a third material selected from a third group consisting of: W, Ti, Cu, Al, Ag, Cu, Pt, Pd, Ta, Ni, Cr, a metal nitride, TiN, TaN, a conductive semiconductor material, SiGe, doped polycrystalline Si, doped SiGe, Si, and an alloy of the foregoing;
the switching material layer comprises a fourth material selected from a fourth group consisting of: amorphous silicon, a silicon sub-oxide, a non-stoichiometric oxide, TiOx, AlOx, HfOx, SiOx, TaOx, CuOx, NbOx, and an intrinsic semiconductor material; or
the bitline material layer comprises a fifth material selected from a fifth group consisting of: W, Ti, Cu, Al, Ag, Cu, Pt, Pd, Ta, Ni, Cr, a metal nitride, TiN, and TaN.

5. The method of claim 1, further comprising depositing a passivating material layer on top of the bitline material layer.

6. The method of claim 1, wherein the via comprises a shape selected from a group consisting of: a cylinder, approximately a cylinder, a rectangular prism, approximately a rectangular prism, a truncated cone and approximately a truncated cone.

7. The method of claim 1, wherein a first memory device comprises:
a portion of the first wordline, the selection material within the first recess of the via, the contact material within the first recess of the via,
a first portion of the switching material layer within the via and laterally adjacent to the selection material within the first recess of the via and laterally adjacent to the contact material within the first recess of the via, and
a first portion of the bitline material layer within the via and laterally adjacent to the first portion of the switching material layer;
and wherein a second memory device comprises:
a portion of the second wordline, the selection material within the second recess of the via, the contact material within the second recess of the via,
a second portion of the switching material layer within the via and laterally adjacent to the selection material within the second recess of the via and laterally adjacent to the contact material within the second recess of the via, and
a second portion of the bitline material layer within the via and laterally adjacent to the second portion of the switching material layer.

8. The method of claim 7, wherein the second memory device is vertically stacked relative to the first memory device.

9. The method of claim 1, wherein the first recess is formed from the first wordline, and the second recess is formed from the second wordline.

10. The method of claim 9, wherein before the forming the via step, the method further comprises:
forming a third wordline from the first wordline material layer;
forming a fourth wordline from the second wordline material layer; and
forming a second via through the third wordline and fourth wordline, wherein the first wordline material layer and the second wordline material layer are over etched within the second via to form a third recess in the third wordline and to form a fourth recess in the fourth wordline.

11. The method of claim 10, wherein:
the first wordline is positioned laterally relative to the third wordline;
the second wordline is positioned laterally relative to the fourth wordline;
the second wordline is positioned vertically above the first wordline; and
the fourth wordline is positioned vertically above the third wordline.

12. A device including at least one three-dimensional memory device comprises:
a first wordline material layer disposed upon an insulated semiconductor substrate;
a first insulating material layer disposed upon the first wordline material layer;
a second wordline material layer disposed upon the first insulating material layer;
a second insulating material layer disposed upon the second wordline material layer;
a via formed through the first wordline material layer, the first insulating material layer, the second wordline material layer and the second insulating material layer, wherein the first wordline material layer and the second wordline material layer are over etched within the via to form a first recess in the first wordline material layer and to form a second recess in the second wordline material layer;
a selection material disposed within the first recess and the second recess of the via, wherein the selection material is in electrical contact with the first wordline material layer and the second wordline material layer;
a contact material disposed within the first recess and the second recess of the via, wherein the contact material is in electrical contact with the selection material;
a switching material layer disposed within the via, in electrical contact with the selection material within the first recess and the second recess of the via and in electrical contact with the contact material within the first recess and the second recess of the via;
a bitline material layer disposed within the via, in electrical contact with the switching material;
wherein a first three-dimensional memory device of the at least one three-dimensional memory device comprises:
a portion of the first wordline material layer,
a first portion of the selection material within the first recess of the via, a first portion of the contact material within the first recess of the via, a first portion of the switching material layer within the via and laterally adjacent to the first portion of the selection material within the first recess of the via and laterally adjacent to the first portion of the contact material within the first recess of the via, and a first portion of the bitline material layer within the via and laterally adjacent to the first portion of the switching material layer; and wherein a second three-dimensional memory device of the at least one three-dimensional memory device comprises:

a portion of the second wordline material layer, a second portion of the selection material within the second recess of the via, a second portion of the contact material within the second recess of the via, a second portion of the switching material layer within the via and laterally adjacent to the second portion of the selection material within the second recess of the via and laterally adjacent to the second portion of the contact material within the second recess of the via, and a second portion of the bitline material layer within the via and laterally adjacent to the second portion of the switching material layer.

13. The device of claim 12, wherein at least one of:

the first wordline material layer comprises a first material selected from a group consisting of: W, Ti, Cu, Al, Ag, Cu, Pt, Pd, Ta, Ni, Cr, a metal nitride, TiN, TaN and an alloy of the foregoing;

the selection material comprises a second material selected from a second group consisting of: an amorphous silicon, a non-stoichiometric oxide, TiOx, AlOx, HfOx, SiOx, TaOx, CuOx, NbOx, an intrinsic semiconductor material, a chalcogenide, and an alloy of the foregoing;

the contact material comprises a third material selected from a third group consisting of: W, Ti, Cu, Al, Ag, Cu, Pt, Pd, Ta, Ni, Cr, a metal nitride, TiN, TaN, a conductive semiconductor material, SiGe, a doped polycrystalline Si, a doped SiGe, Si, and an alloy of the foregoing;

the switching material layer comprises a fourth material selected from a fourth group consisting of: an amorphous silicon, a non-stoichiometric oxide, TiOx, AlOx, HfOx, SiOx, TaOx, CuOx, NbOx, and an intrinsic semiconductor material; or the bitline material layer comprises a fifth material selected from a fifth group consisting of: W, Ti, Cu, Al, Ag, Cu, Pt, Pd, Ta, Ni, Cr, a metal nitride, TiN, and TaN.

14. The device of claim 12, wherein the via comprises a shape selected from a group consisting of: approximately a cylinder, approximately a rectangular prism, and approximately a truncated cone.

15. The device of claim 12, further comprising:

a first wordline in the first wordline material layer, and a second wordline in the second wordline material layer.

16. The device of claim 15, wherein the second three-dimensional memory device is vertically stacked relative to the first three-dimensional memory device.

17. The device of claim 16, wherein:

the first recess is formed from the first wordline; and the second recess is formed from the second wordline.

18. The device of claim 17, further comprising:

a third wordline comprising a second portion of the first wordline material layer;

a fourth wordline comprising a second portion of the second wordline material layer; and a second via through the third wordline and the fourth wordline, wherein the first wordline material layer and the second wordline material layer are over etched within the second via to form a third recess in the third wordline and to form a fourth recess in the fourth wordline.

19. The device of claim 18, wherein:

the first wordline is positioned laterally relative to the third wordline;

the second wordline is positioned laterally relative to the fourth wordline;

the second wordline is positioned vertically above the first wordline; and the fourth wordline is positioned vertically above the third wordline.

20. The device of claim 12, wherein:

the insulated semiconductor substrate comprises a plurality of complementary metal oxide semiconductor (CMOS) devices fabricated therein;

the plurality of CMOS devices are selected from a group consisting of: a processor, a logic array, a buffer, bitline controller, wordline controller, and a controller;

the portion of the first wordline material layer is coupled to at least a first portion of the plurality of CMOS devices, the method further comprising:

coupling a visual display to at least a second portion of the plurality of CMOS devices;

coupling a wireless communication interface to at least a third portion of the plurality of CMOS devices;

coupling a power source to at least a fourth portion of the plurality of CMOS devices; and disposing the insulated semiconductor substrate, the visual display, the wireless communication interface, and the power source within an enclosure.

* * * * *